United States Patent
Sakakibara

(10) Patent No.: US 11,272,128 B2
(45) Date of Patent: Mar. 8, 2022

(54) SOLID-STATE IMAGING ELEMENT, IMAGING DEVICE, AND METHOD FOR CONTROLLING SOLID-STATE IMAGING ELEMENT

(71) Applicant: Sony Semiconductor Solutions Corporation, Kanagawa (JP)

(72) Inventor: Masaki Sakakibara, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/958,929

(22) PCT Filed: Sep. 18, 2018

(86) PCT No.: PCT/JP2018/034438
§ 371 (c)(1),
(2) Date: Jun. 29, 2020

(87) PCT Pub. No.: WO2019/135304
PCT Pub. Date: Jul. 11, 2019

(65) Prior Publication Data
US 2020/0344432 A1    Oct. 29, 2020

(30) Foreign Application Priority Data

Jan. 5, 2018    (JP) .............................. JP2018-000715

(51) Int. Cl.
*H04N 5/361*    (2011.01)
*H04N 5/374*    (2011.01)
(Continued)

(52) U.S. Cl.
CPC ....... *H04N 5/361* (2013.01); *H01L 27/14612* (2013.01); *H04N 5/378* (2013.01); *H04N 5/3745* (2013.01)

(58) Field of Classification Search
CPC ...... H04N 5/361; H04N 5/3745; H04N 5/378; H04N 5/335; H04N 5/345; H04N 5/376;
(Continued)

(56) References Cited

U.S. PATENT DOCUMENTS 8,953,974 B2 * 2/2015 Nomura ................. H04N 5/378
350/208.1
10,021,325 B2 * 6/2018 Miyamoto ............. H04N 5/369
(Continued)

*Primary Examiner* — Marly S Camargo
(74) *Attorney, Agent, or Firm* — Michael Best & Friedrich LLP

(57) ABSTRACT

In a solid-state imaging element that detects a change in an amount of light on the basis of a photocurrent, erroneous detection due to a dark current or dark current shot noise is reduced.
The solid-state imaging element includes a limiting circuit, a differentiating circuit, and a comparison circuit. The limiting circuit limits an electric signal generated by photoelectric conversion by a predetermined limit value and outputs the electric signal limited as an output signal. The differentiating circuit obtains an amount of change of the output signal output from the limiting circuit. The comparison circuit performs comparison between the amount of change obtained by the differentiating circuit and a predetermined threshold value to output a result of the comparison as a result of detection of an address event.

12 Claims, 24 Drawing Sheets

(51) Int. Cl.
  *H04N 5/378* (2011.01)
  *H04N 5/335* (2011.01)
  *H04N 5/345* (2011.01)
  *H04N 5/376* (2011.01)
  *H04N 5/369* (2011.01)
  *H04N 9/04* (2006.01)
  *H01L 27/146* (2006.01)
  *H01L 39/16* (2006.01)
  *H04N 5/3745* (2011.01)

(58) Field of Classification Search
  CPC ...... H04N 5/379; H04N 5/369; H04N 5/3355; H04N 9/04511; H01L 27/14612; H01L 39/16
  See application file for complete search history.

(56) References Cited

U.S. PATENT DOCUMENTS

| | | | |
|---|---|---|---|
| 2006/0197664 A1* | 9/2006 | Zhang | G08B 13/18 340/555 |
| 2008/0180534 A1* | 7/2008 | Murayama | H04N 5/232 348/208.4 |
| 2014/0210554 A1* | 7/2014 | Abdelhalem | H03F 1/0205 330/296 |
| 2016/0298982 A1* | 9/2016 | Sugizaki | H03F 3/082 |
| 2018/0167575 A1* | 6/2018 | Watanabe | H04N 55/3745 |
| 2021/0144317 A1* | 5/2021 | Berner | H04N 5/378 |
| 2021/0235036 A1* | 7/2021 | Kitano | H04N 5/3745 |

* cited by examiner a b

SOLID-STATE IMAGING ELEMENT, IMAGING DEVICE, AND METHOD FOR CONTROLLING SOLID-STATE IMAGING ELEMENT

TECHNICAL FIELD

The present technology relates to a solid-state imaging element, an imaging device, and a method for controlling the solid-state imaging element. More specifically, the present technology relates to a solid-state imaging element that detects a change in luminance, an imaging device, and a method for controlling the solid-state imaging element.

BACKGROUND ART

A synchronous solid-state imaging element that captures image data in synchronization with a synchronization signal such as a vertical synchronization signal has been conventionally used in an imaging device or the like. Since the image data can be acquired only at every synchronization signal period (for example, 1/60 seconds) with this general synchronous solid-state imaging element, it is difficult to cope with a case where higher-speed processing is required in fields related to traffic, robots, and the like. Thus, an asynchronous solid-state imaging element has been devised that detects an address event for each pixel without using a synchronization signal (for example, see Patent Document 1). Here, the address event means that an amount of change in an amount of light exceeds a threshold value at a certain pixel address. The address event is detected by comparing a voltage obtained by converting a photocurrent with a threshold value. A solid-state imaging element that detects an address event for each pixel in this way is called a Dynamic Vision Sensor (DVS).

CITATION LIST

Non-Patent Document

Non-Patent Document 1: Patrick Lichtsteiner, et al., A 128 128 120 dB 15 μs Latency Asynchronous Temporal Contrast Vision Sensor, IEEE JOURNAL OF SOLID-STATE CIRCUITS, VOL. 43, NO. 2, FEBRUARY 2008.

SUMMARY OF THE INVENTION

Problems to be Solved by the Invention

The asynchronous solid-state imaging element described above can generate and output data at a much higher speed than the synchronous solid-state imaging element. For this reason, for example, in the traffic field, image recognition processing for a person or an obstacle can be executed at high speed, and safety can be improved. However, under low illuminance, the voltage may change due to a dark current, and the address event may be detected even though there is no change in the amount of light. There is a problem that noise is generated in the image data due to the erroneous detection.

The present technology has been created in view of such a situation, and aims to reduce erroneous detection due to a dark current or dark current shot noise in a solid-state imaging element that detects a change in the amount of light on the basis of a photocurrent.

Solutions to Problems

The present technology has been made to solve the above-described problem, and a first aspect of the present technology is a solid-state imaging element including: a limiting circuit that limits an electric signal generated by photoelectric conversion by a predetermined limit value and outputs the electric signal limited as an output signal; a differentiating circuit that obtains an amount of change of the output signal; and a comparison circuit that performs comparison between the amount of change and a predetermined threshold value to output a result of the comparison as a result of detection of an address event, and a method for controlling the solid-state imaging element. This brings about an effect that the address event is detected from the electric signal limited by the limit value.

Furthermore, in the first aspect, the predetermined limit value is a lower limit value of a current, and the limiting circuit may include: a photoelectric conversion element that generates a current as the electric signal by the photoelectric conversion for incident light; an offset current source that generates an offset current indicating the lower limit value, and supplies the offset current as a conversion target current in a case where the photocurrent is less than the offset current; and a current-to-voltage conversion unit that performs current-to-voltage conversion on the conversion target current and outputs the conversion target current converted as the output signal to the differentiating circuit. This brings about an effect that the address event is detected from the photocurrent that does not fall below the offset current.

Furthermore, in the first aspect, the offset current source may be a transistor connected in parallel with the photoelectric conversion element between the current-to-voltage conversion unit and a predetermined reference potential. This brings about an effect that the address event is detected from the photocurrent that does not fall below the offset current generated by the transistor connected in parallel with the photoelectric conversion element.

Furthermore, in the first aspect, the offset current source may include: a reference current source that generates a predetermined reference current; a distribution circuit that distributes the predetermined reference current at a plurality of ratios different from each other to generate a plurality of distribution currents; and a decoder that controls and causes the distribution circuit to output a sum of a predetermined number of the plurality of distribution currents as the offset current. This brings about an effect that the sum of the predetermined number of the plurality of distribution currents obtained by distributing the reference current is output as the offset current.

Furthermore, in the first aspect, the limiting circuit, the differentiating circuit, and the comparison circuit may be provided for each of a plurality of pixels arranged in a two-dimensional lattice. This brings about an effect that the address event is detected in each of the plurality of pixels.

Furthermore, in the first aspect, the solid-state imaging element may further include: an event detection count holding unit that holds a detection count that the address event is detected for each of the plurality of pixels; a filter that sequentially focuses on each of the plurality of pixels and reads from the event detection count holding unit the detection count of each of a pixel of interest that is focused and a pixel adjacent to the pixel of interest to execute predetermined filter processing; and an offset current control unit that controls the offset current for each of the plurality of pixels on the basis of an execution result of the filter processing. This brings about an effect that the offset current is controlled on the basis of the execution result of the filter processing.

Furthermore, in the first aspect, the predetermined limit value is a cutoff frequency, and the limiting circuit may include: a photoelectric conversion element that generates a photocurrent by the photoelectric conversion for incident light; a current-to-voltage conversion unit that generates a voltage as the electric signal by performing current-to-voltage conversion on the photocurrent; and a low pass filter that limits a high frequency component of a frequency exceeding the cutoff frequency in a signal of the voltage to output the signal limited as the output signal. This brings about an effect that the output signal is output in which the high frequency component is limited.

Furthermore, a second aspect of the present technology is an imaging device including: a limiting circuit that limits an electric signal generated by photoelectric conversion by a predetermined limit value and outputs the electric signal limited as an output signal; a differentiating circuit that obtains an amount of change of the output signal; a comparison circuit that performs comparison between the amount of change and a predetermined threshold value to output a result of the comparison as a result of detection of an address event; and a signal processing unit that executes predetermined signal processing on the result of the detection. This brings about an effect that the address event is detected from the electric signal limited by the limit value, and the predetermined signal processing is executed on the result of the detection.

Effects of the Invention

According to the present technology, an excellent effect can be achieved that, in a solid-state imaging element that detects a change in an amount of light on the basis of a photocurrent, erroneous detection due to a dark current or dark current shot noise can be reduced. Note that, the effect described here is not necessarily limited, and can be any effect described in the present disclosure.

MODE FOR CARRYING OUT THE INVENTION

The following is a description of a mode for carrying out the present technology (the mode will be hereinafter referred to as the embodiment). The description will be made in the following order.

1. First embodiment (an example in which an electric signal is limited by a limit value)

2. Second embodiment (an example in which an electric signal is limited by a limit value, and the limit value is statically changed)

3. Third embodiment (an example in which an electric signal is limited by a limit value, and the limit value is dynamically changed)

4. Fourth embodiment (an example in which a frequency of an electric signal is limited by a limit value)

5. Application example to mobile body

1. First Embodiment

[Configuration Example of Imaging Device]

Figure 1:
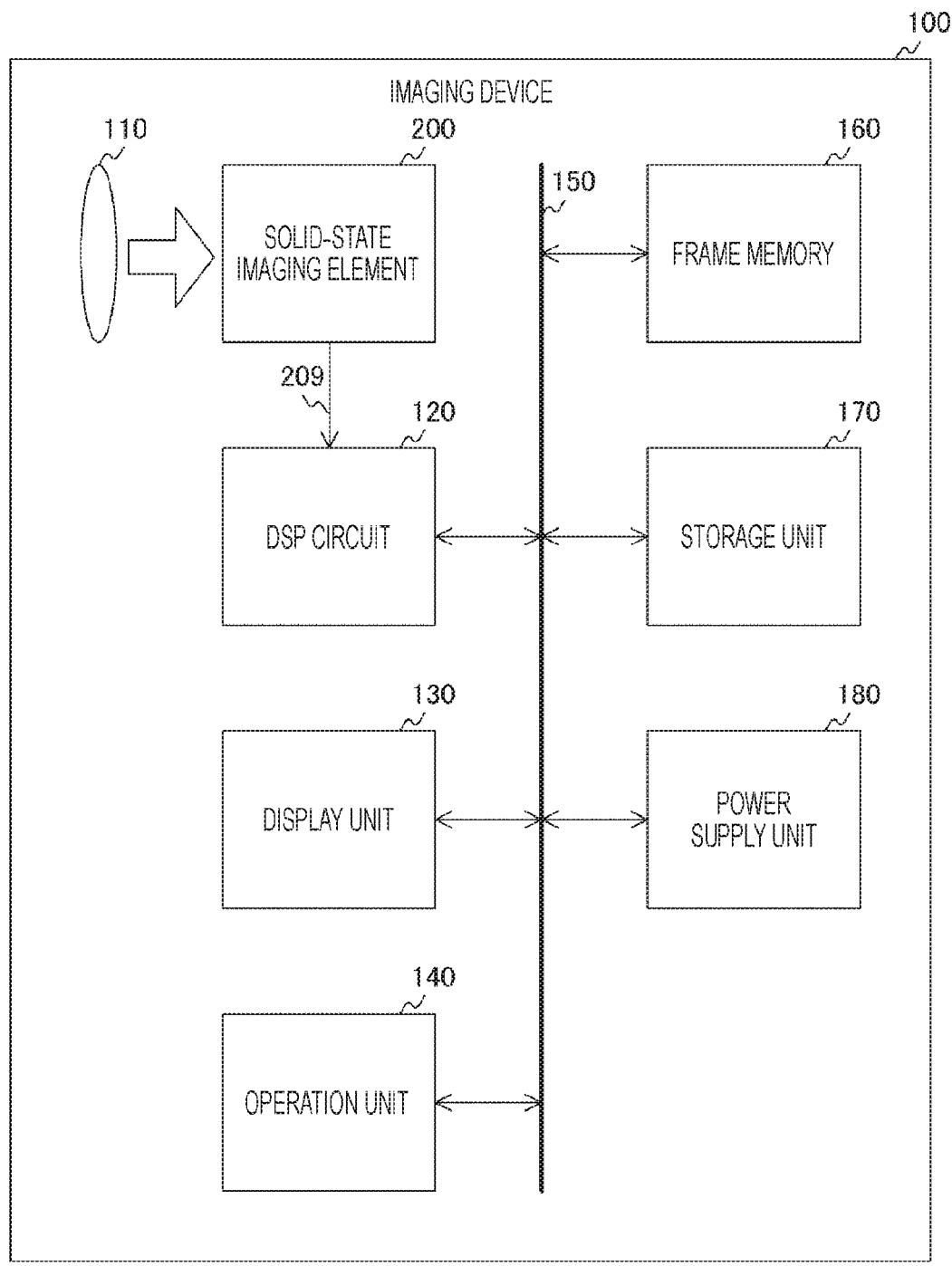
FIG. 1 is a block diagram illustrating a configuration example of an imaging device in a first embodiment of the present technology.

FIG. 1 is a block diagram illustrating a configuration example of an imaging device 100 in a first embodiment of the present technology. The imaging device 100 is a device for capturing image data, and includes an optical unit 110, a solid-state imaging element 200, and a Digital Signal Processing (DSP) circuit 120. The imaging device 100 further includes a display unit 130, an operation unit 140, a bus 150, a frame memory 160, a storage unit 170, and a power supply unit 180. As the imaging device 100, a camera mounted on an industrial robot, an in-vehicle camera, or the like is assumed.

The optical unit 110 collects light from a subject and guides the light to the solid-state imaging element 200. The solid-state imaging element 200 detects, as an address event, that the absolute value of an amount of change in luminance exceeds the absolute value of a threshold value, for each pixel. The address event includes, for example, an ON event indicating that a positive amount of change in luminance exceeds a positive threshold value, and an OFF event indicating that a negative amount of change falls below a negative threshold value. The solid-state imaging element 200 generates image data representing the presence or absence of each of the ON event and the OFF event for each pixel by 2-bit data, and supplies the image data to the DSP circuit 120 via a signal line 209.

The DSP circuit 120 executes predetermined signal processing on the image data from the solid-state imaging element 200. The DSP circuit 120 outputs the processed image data and event data to the frame memory 160 and the like via the bus 150. Note that, the DSP circuit 120 is an example of a signal processing unit described in the claims.

The display unit 130 displays the image data and event data. As the display unit 130, for example, a liquid crystal panel or an organic electro luminescence (EL) panel is assumed. The operation unit 140 generates an operation signal in accordance with user operation.

The bus 150 is a common path through which the optical unit 110, the solid-state imaging element 200, the DSP circuit 120, the display unit 130, the operation unit 140, the frame memory 160, the storage unit 170, and the power supply unit 180 exchange data with each other.

The frame memory 160 holds the image data. The storage unit 170 stores various data such as the image data. The power supply unit 180 supplies power to the solid-state imaging element 200, the DSP circuit 120, the display unit 130, and the like.

Note that, there may be a plurality of the solid-state imaging elements 200, and there may be a plurality of solid-state hearing devices called silicon inner ears (coherers).

[Configuration Example of Solid-State Imaging Element]

Figure 2:
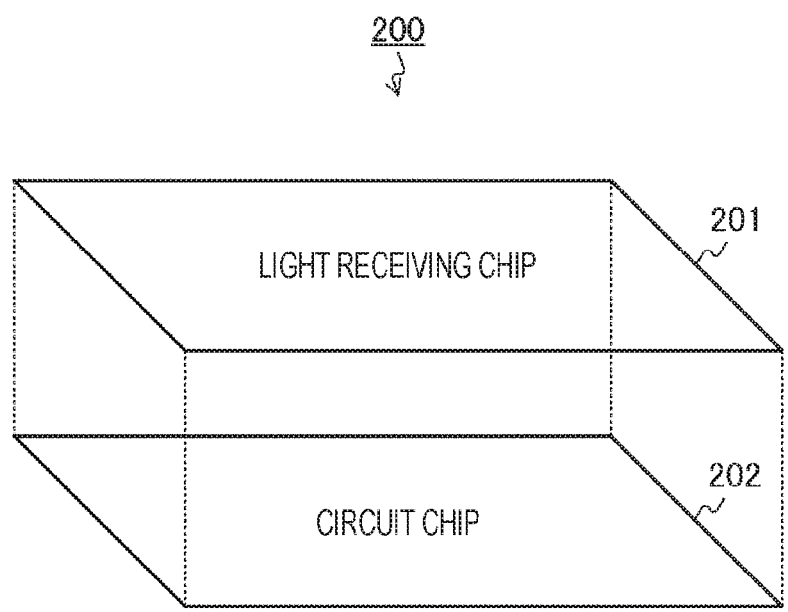
FIG. 2 is a diagram for explaining a laminated structure of a solid-state imaging element in the first embodiment of the present technology.

FIG. 2 is a diagram illustrating an example of a laminated structure of the solid-state imaging element 200 in the first embodiment of the present technology. The solid-state imaging element 200 includes a light receiving chip 201 and a circuit chip 202 laminated on the light receiving chip 201.

Figure 3:
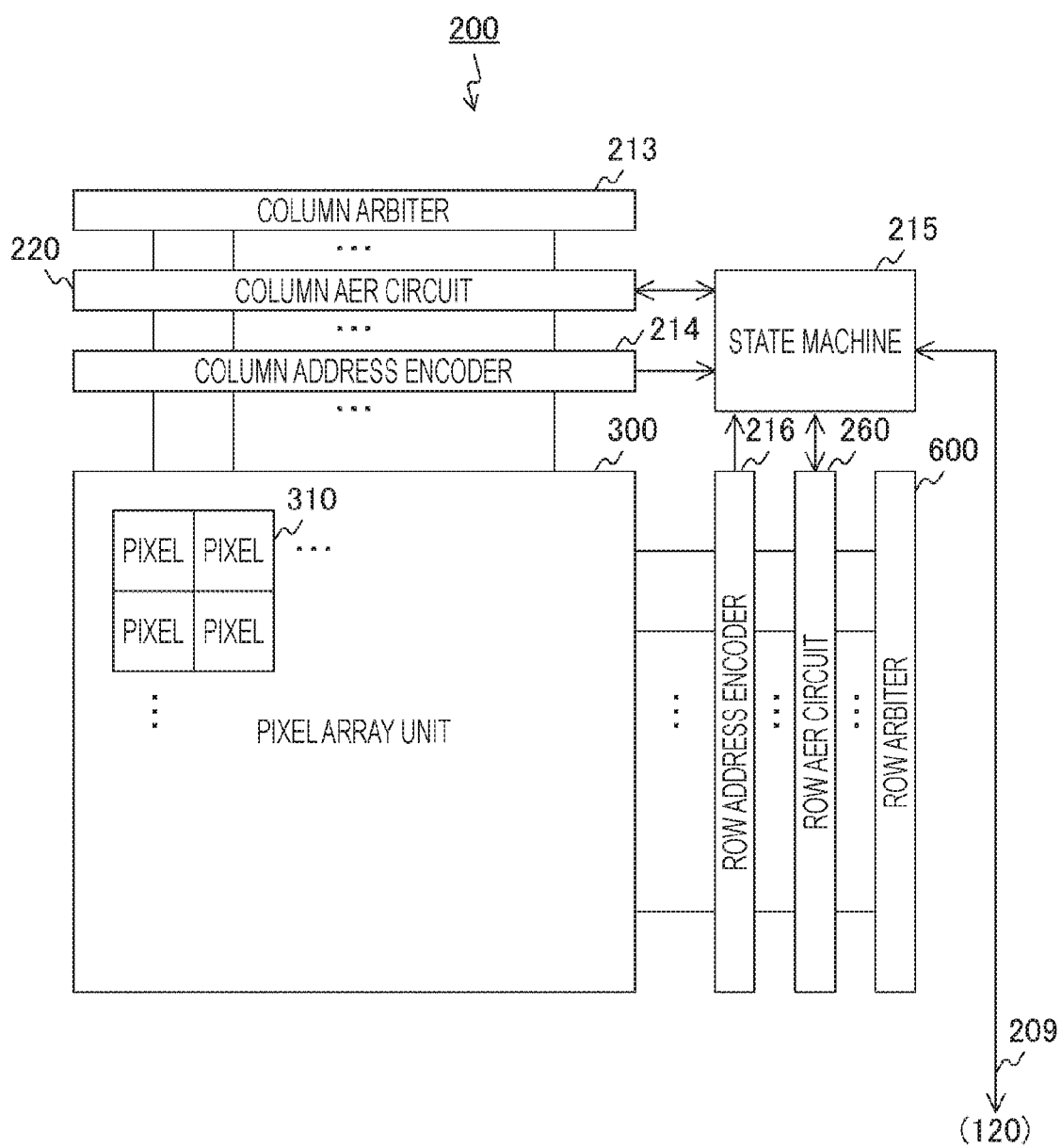
FIG. 3 is a block diagram illustrating a configuration example of the solid-state imaging element in the first embodiment of the present technology.

FIG. 3 is a block diagram illustrating a configuration example of the solid-state imaging element 200 in the first embodiment of the present technology. The solid-state imaging element 200 includes a column arbiter 213, a column AER circuit 220, a column address encoder 214, a pixel array unit 300, and a state machine 215. Furthermore, the solid-state imaging element 200 includes a row address encoder 216, a row AER circuit 260, and a row arbiter 600. Then, in the pixel array unit 300, a plurality of pixels 310 is arranged in a two-dimensional lattice. Hereinafter, a set of pixels arranged in a predetermined direction in the pixel array unit 300 is referred to as a "row", and a set of pixels arranged in a direction perpendicular to the row is referred to as a "column".

Each of the pixels in the pixel array unit 300 generates a differential signal indicating an amount of change in voltage depending on a photocurrent, and performs comparison between the level of the signal and a predetermined threshold value. A result of the comparison indicates a result of detection of an address event. Here, the threshold value for the comparison with the differential signal includes two threshold values different from each other, of which the larger one is set as an upper threshold value and the smaller one is set as a lower threshold value. Furthermore, the address event includes an ON event and an OFF event, and the result of the detection of the address event includes a 1-bit ON event detection result and a 1-bit OFF event detection result. The ON event is detected when the differential signal exceeds the upper threshold value, and the OFF event is detected when the differential signal falls below the lower threshold value.

The pixel 310 performs transmission/reception of a request and a response (hereinafter, referred to as "handshaking") to the row AER circuit 260 when the address event is detected, to externally output the result of the detection of the address event. Then, the pixel 310 performs handshaking with the column AER circuit 220.

The column arbiter 213 arbitrates the requests from the column AER circuit 220 and transmits the responses to the column AER circuit 220 on the basis of the arbitration result.

The column AER circuit 220 performs transmission/reception (handshaking) of the request and response for requesting external output of the result of the detection of the address event between each of the columns, the column arbiter 213, and the state machine 215.

The column address encoder 214 encodes an address of a column in which the address event has occurred and transmits the address to the state machine 215.

The row address encoder 216 encodes an address of a row in which the address event has occurred and transmits the address to the state machine 215.

The row arbiter 600 arbitrates the requests from the row AER circuit 260 and transmits the responses to the row AER circuit 260 on the basis of the arbitration result.

The row AER circuit 260 performs transmission/reception (handshaking) of the request and response for requesting external output of the result of the detection of the address event between each of the rows, the row arbiter 600, and the state machine 215.

The state machine 215 performs handshaking with the column AER circuit 220 and the row AER circuit 260. Upon receiving the requests from the column AER circuit 220 and the row AER circuit 260, the state machine 215 decodes data from the column address encoder 214 and the row address encoder 216, and specifies an address where the address event is detected. Image data is generated by arranging results of detection of address events of respective pixels in a two-dimensional lattice. The state machine 215 supplies the image data to the DSP circuit 120.

[Configuration Example of Pixel]

Figure 4:
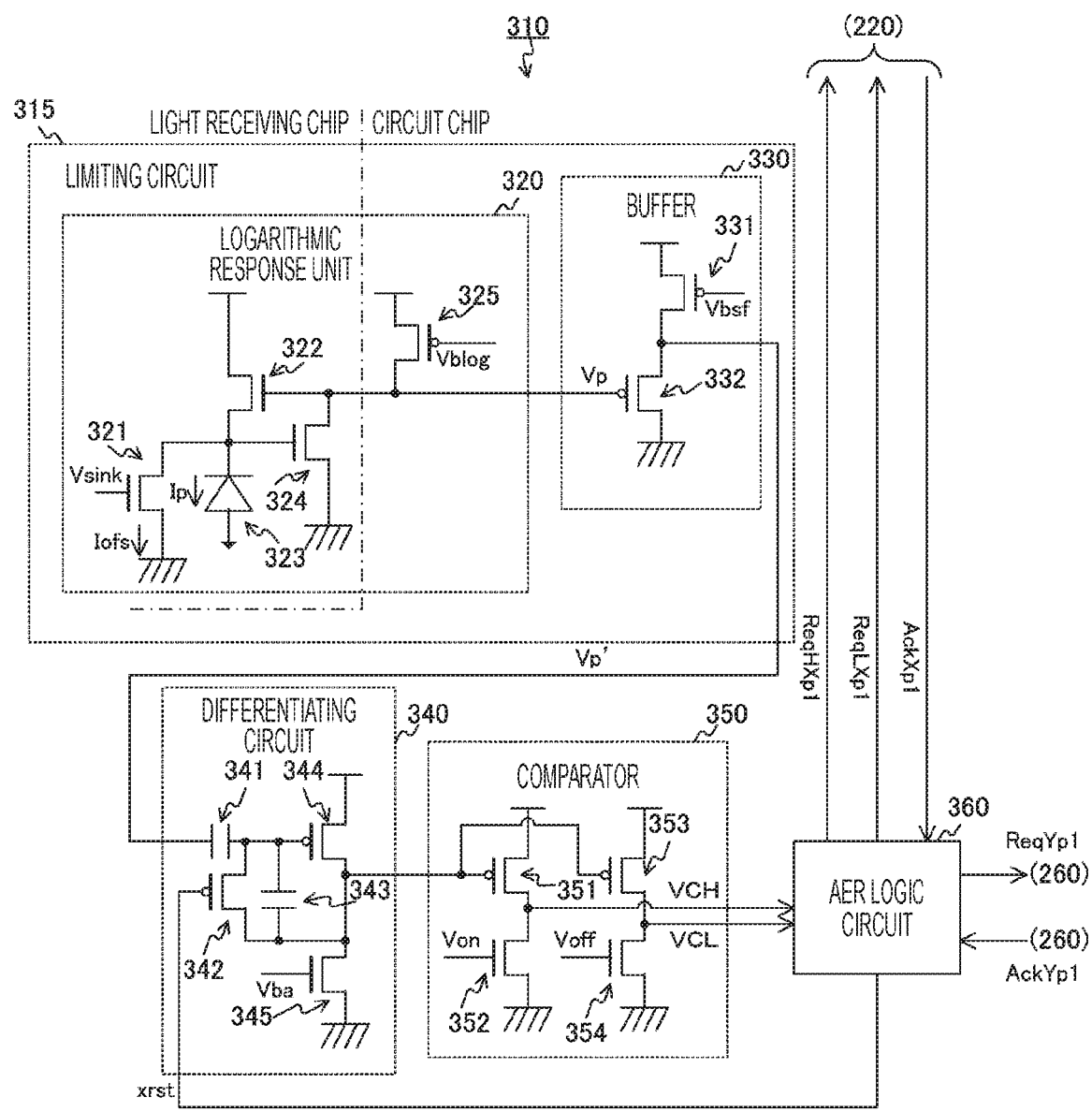
FIG. 4 is a circuit diagram illustrating a configuration example of a pixel in the first embodiment of the present technology.

FIG. 4 is a circuit diagram illustrating a configuration example of the pixel 310 in the first embodiment of the present technology. The pixel 310 includes a limiting circuit 315, a differentiating circuit 340, a comparator 350, and an AER logic circuit 360.

The limiting circuit 315 outputs, as an output signal Vp', a signal obtained by limiting an electric signal generated by photoelectric conversion by a predetermined limit value (such as a lower limit value of a current). The limiting circuit 315 includes a logarithmic response unit 320 and a buffer 330.

The logarithmic response unit 320 includes negative channel MOS (nMOS) transistors 321, 322, and 324, a photodiode 323, and a positive channel MOS (pMOS) transistor 325.

The photodiode 323 generates a photocurrent Ip as an electric signal by photoelectric conversion for incident light. Note that, the photodiode 323 is an example of a photoelectric conversion element described in the claims.

The nMOS transistor 321 generates a constant offset current Iofs. The nMOS transistor 321 is connected in parallel with the photodiode 323 between a reference potential (such as ground) and a connection point between the nMOS transistor 322 and the photodiode 323, and a drain current of the nMOS transistor 321 is used as the offset current Iofs. Then, a predetermined bias voltage Vsink is applied to the gate of the nMOS transistor 321. The bias voltage Vsink is set so that the drain current (offset current Iofs) is greater than a dark current. Note that, the nMOS transistor 321 is an example of an offset current source described in the claims.

The pMOS transistor 325 and the nMOS transistor 324 are connected in series between a power supply and a ground terminal. Furthermore, the gate of the nMOS transistor 322 is connected to a connection point between the pMOS transistor 325 and the nMOS transistor 324, the source is connected to the photodiode 323, and the drain is connected to the power supply. Then, a bias voltage Vblog is applied to the gate of the pMOS transistor 325.

As described above, the nMOS transistor 321 is connected in parallel with the photodiode 323 between the reference potential and the connection point between the nMOS transistor 322 and the photodiode 323. With this connection, in a case where the photocurrent Ip generated by the photodiode 323 is less than the offset current Iofs, the offset current source (the nMOS transistor 321) supplies, to the connection point, the constant offset current Iofs as a conversion target current Ip' to be converted into a voltage. That is, in a case where the actually generated photocurrent Ip is less than the offset current Iofs, the conversion target current Ip' is clipped to the constant offset current Iofs. On the other hand, if the photocurrent Ip is greater than or equal to the offset current Iofs, the connection point is supplied with the photocurrent Ip as it is as the conversion target current Ip'. That is, the conversion target current Ip' is limited to a range greater than or equal to the lower limit value, with a value of the offset current Iofs as the lower limit value.

A circuit including the nMOS transistors 322 and 324 and the pMOS transistor 325 performs current-to-voltage conversion on the conversion target current Ip' limited to the range greater than or equal to the lower limit value (offset current Iofs), to generate a pixel voltage Vp. A value of the pixel voltage Vp is a logarithmic value of the conversion target current Ip'. Note that, the circuit including the nMOS transistors 322 and 324 and the pMOS transistor 325 is an example of a current-to-voltage conversion unit described in the claims.

Furthermore, the photodiode 323 and the nMOS transistors 321, 322, and 324 are arranged on the light receiving chip 201. On the other hand, the pMOS transistor 325 and subsequent circuits are arranged on the circuit chip 202.

Furthermore, the buffer 330 includes pMOS transistors 331 and 332 connected in series between the power supply and the ground terminal. The gate of the pMOS transistor 332 on the ground side is connected to the logarithmic response unit 320, and a bias voltage Vbsf is applied to the gate of the pMOS transistor 331 on the power supply side. Furthermore, a connection point between the pMOS transistors 331 and 332 is connected to the differentiating circuit 340. With this connection, impedance conversion is performed on the pixel voltage Vp, and a signal of the converted voltage is output to the differentiating circuit 340 as the output signal Vp'.

The differentiating circuit 340 includes capacitances 341 and 343, pMOS transistors 342 and 344, and an nMOS transistor 345.

One end of the capacitance 341 is connected to the buffer 330, and the other end is connected to one end of the capacitance 343 and the gate of the pMOS transistor 344. A reset signal xrst is input to the gate of the pMOS transistor 342, and the source and the drain are connected to both ends of the capacitance 343. The pMOS transistor 344 and the nMOS transistor 345 are connected in series between the power supply and the ground terminal. Furthermore, the other end of the capacitance 343 is connected to a connection point between the pMOS transistor 344 and the nMOS transistor 345. A bias voltage Vba is applied to the gate of the nMOS transistor 345 on the ground side, and the connection point between the pMOS transistor 344 and the nMOS transistor 345 is also connected to the comparator 350. With such a connection, a differential signal indicating an amount of change in the output signal Vp' is generated and output to the comparator 350. Furthermore, the differential signal is initialized by the reset signal xrst.

The comparator 350 includes pMOS transistors 351 and 353 and nMOS transistors 352 and 354. The pMOS transistor 351 and the nMOS transistor 352 are connected in series between the power supply and the ground terminal, and the pMOS transistor 353 and the nMOS transistor 354 are also connected in series between the power supply and the ground terminal. Furthermore, the gates of the pMOS transistors 351 and 353 are connected to the differentiating circuit 340. A predetermined upper threshold value Von is applied to the gate of the nMOS transistor 352, and a predetermined lower threshold value Voff is applied to the gate of the nMOS transistor 354.

A connection point between the pMOS transistor 351 and the nMOS transistor 352 is connected to the AER logic circuit 360, and a voltage at the connection point is output as a comparison result VCH. A connection point between the pMOS transistor 353 and the nMOS transistor 354 is also connected to the AER logic circuit 360, and a voltage at the connection point is output as a comparison result VCL. With such a connection, the comparator 350 outputs the comparison result VCH at the high level in a case where the differential signal exceeds the upper threshold value Von, and outputs the comparison result VCL at the low level in a case where the differential signal falls below the lower threshold value Voff. The comparison result VCH indicates an ON event detection result, and the comparison result VCL indicates an OFF event detection result. Note that, the comparator 350 is an example of a comparison circuit described in the claims.

Note that, although the comparator 350 detects both an ON event and an OFF event, the comparator 350 may detect only one of the ON event or the OFF event. For example, when only the ON event is to be detected, only the corresponding pMOS transistor 351 and nMOS transistor 352 are arranged.

The AER logic circuit 360 performs handshaking on the basis of the comparison results VCH and VCL. In a case where an address event occurs, the AER logic circuit 360 performs handshaking with the row AER circuit 260. Then, the AER logic circuit 360 performs handshaking with the column AER circuit 220, and resets the differentiating circuit 340 by the reset signal xrst.

Note that, although the photodiode 323 and the nMOS transistors 321, 322, and 324 are arranged on the light receiving chip 201, and others are arranged on the circuit chip 202, the circuit arranged on each chip is not limited to this configuration. For example, only the photodiode 323 can be arranged on the light receiving chip 201, and others can be arranged on the circuit chip 202. Furthermore, the logarithmic response unit 320 can be arranged on the light receiving chip 201, and others can be arranged on the circuit chip 202. Furthermore, the logarithmic response unit 320 and the buffer 330 can be arranged on the light receiving chip 201, and others can be arranged on the circuit chip 202. Furthermore, the logarithmic response unit 320, the buffer 330, and the capacitance 341 can be arranged on the light receiving chip 201, and others can be arranged on the circuit chip 202. Furthermore, the logarithmic response unit 320, the buffer 330, the differentiating circuit 340, and the comparator 350 can be arranged on the light receiving chip 201, and others can be arranged on the circuit chip 202.

Furthermore, although the solid-state imaging element 200 detects an address event asynchronously, image data can be captured in synchronization with a vertical synchronization signal. In this case, it is only required to further provide, for each pixel, at least a floating diffusion layer that accumulates electric charge, a transfer transistor that transfers the electric charge, a reset transistor that initializes an amount of the electric charge, and a selection transistor that outputs a pixel signal in accordance with a selection signal. Furthermore, in the solid-state imaging element 200, an Analog-to-Digital Converter (ADC) that converts the pixel signal into a digital signal is further provided for each pixel or for each column. Furthermore, a drive circuit that sequentially drives the pixels, and a signal processing circuit that reads and processes the digital signal are further provided. Furthermore, in a configuration in which image capturing is performed in synchronization with the vertical synchronization signal, pixels that detect an address event do not have to be all pixels, and may be, for example, one for every three pixels.

Figure 5:
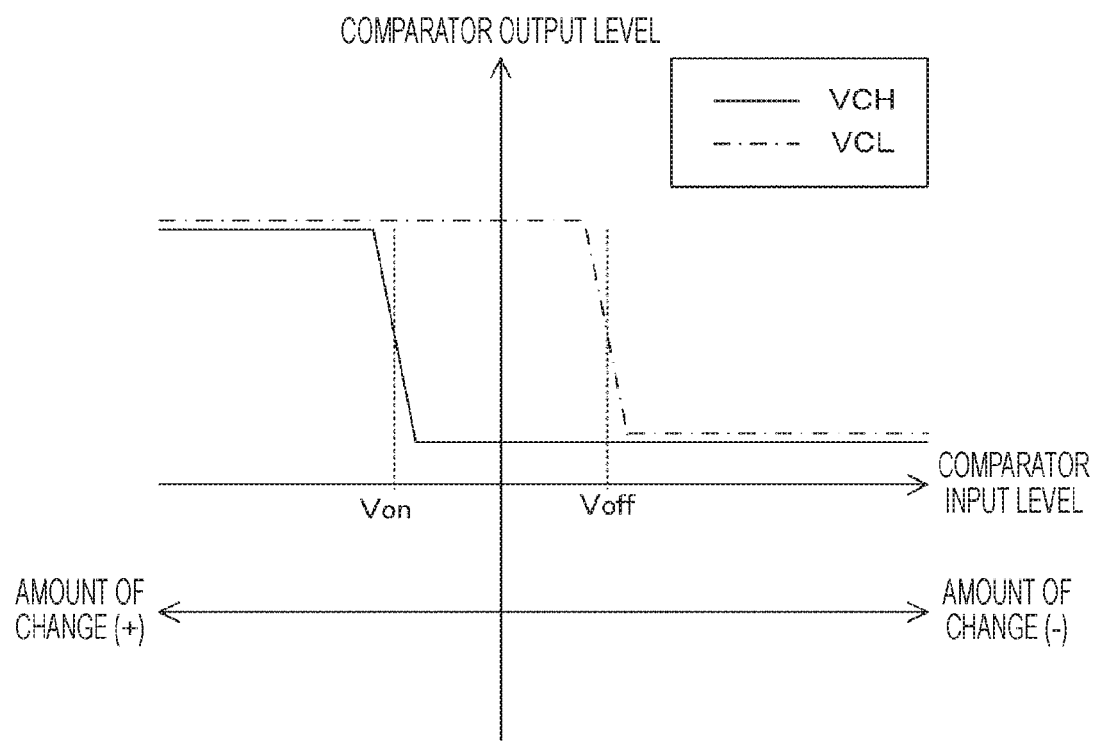
FIG. 5 is a graph illustrating an example of input-output characteristics of a comparator in the first embodiment of the present technology.

FIG. 5 is a graph illustrating an example of input-output characteristics of the comparator 350 in the first embodiment of the present technology. In the figure, the vertical axis indicates a level of an output signal (VCH or VCL) of the comparator 350, and the horizontal axis indicates a level of an input signal (differential signal) of the comparator 350. Furthermore, the solid line indicates a locus of the comparison result VCH, and the one-dot chain line indicates a locus of the comparison result VCL.

When an amount of change in voltage depending on luminance (that is, the differential signal) exceeds the upper threshold value Von, the comparison result VCH changes from the low level to the high level, and an ON event is detected. On the other hand, when the differential signal falls below the lower threshold value Voff, the comparison result VCL changes from the high level to the low level, and an OFF event is detected.

Figure 6:
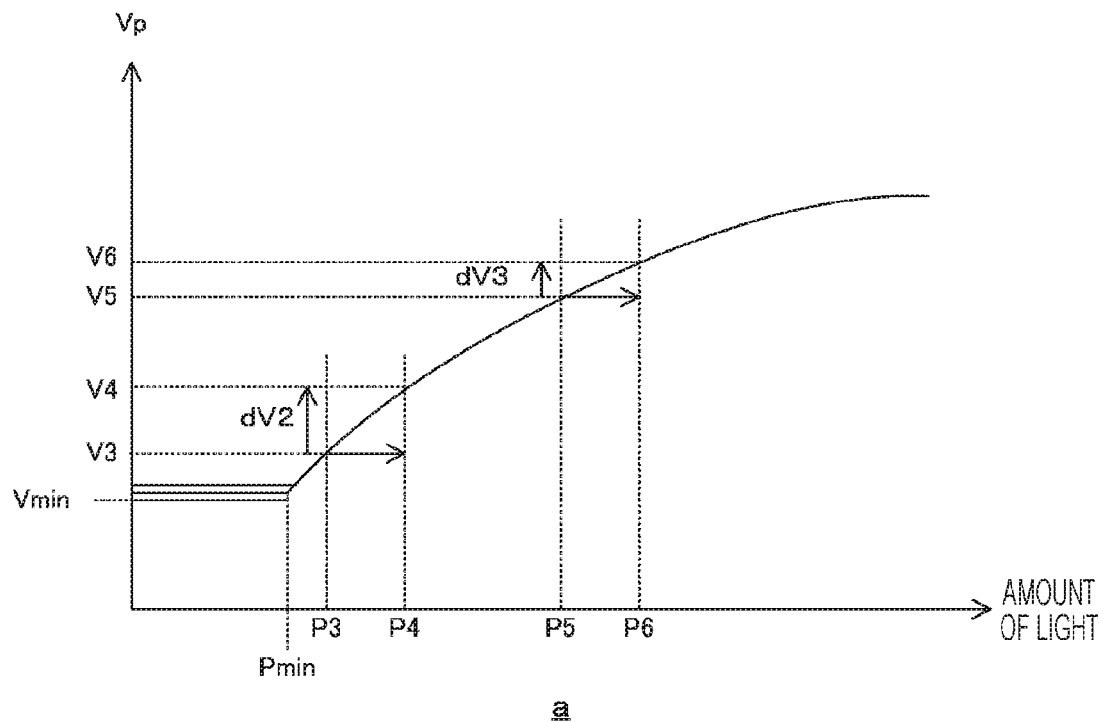
FIG. 6 illustrates graphs of examples of characteristics of logarithmic response units in the first embodiment of the present technology and a comparative example.
Figure 6:
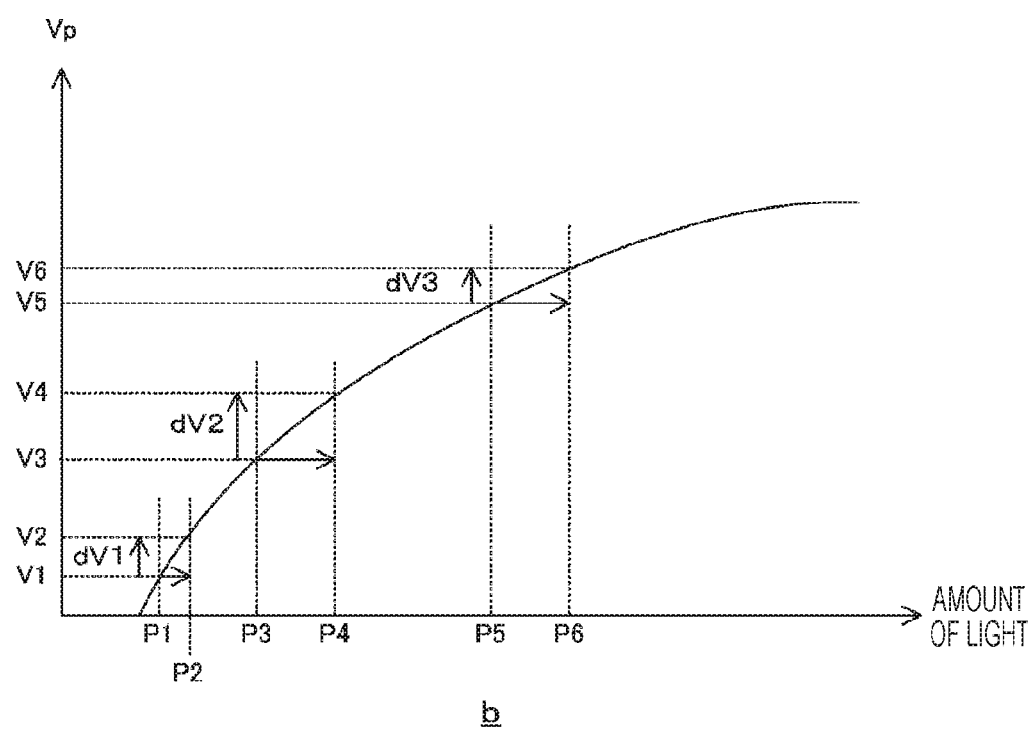

FIG. 6 illustrates graphs of examples of characteristics of logarithmic response units in the first embodiment of the present technology and a comparative example. In a of the figure, a graph is illustrated of an example of the characteristic of the logarithmic response unit 320 that limits the conversion target current Ip' to the range greater than or equal to the offset current Iofs. In b of the figure, a graph is illustrated of an example of the characteristic of the logarithmic response unit of the comparative example that does not limit the conversion target current Ip'. Furthermore, the vertical axis in the figure indicates the pixel voltage Vp output from the logarithmic response unit, and the horizontal axis in the figure indicates an amount of light of incident light.

The logarithmic response unit 320 converts the conversion target current depending on the amount of light into the pixel voltage Vp of a logarithmic value of the conversion target current. The conversion target current Ip' is limited to the range greater than or equal to the offset current Iofs, so that when an amount of light corresponding to Iofs is Pmin, the pixel voltage Vp is limited to a range greater than or equal to Vmin corresponding to the amount of light Pmin. As described above, the offset current Iofs is greater than the dark current, so that the pixel voltage Vp is not less than Vmin even if the dark current occurs without incident light. Then, even if the dark current fluctuates, the pixel voltage remains Vmin and hardly fluctuates. For this reason, the differential signal indicating the amount of change in the pixel voltage has a value close to zero. As described above, the differential signal has a value within a range greater than or equal to the lower threshold value Voff and less than or equal to the upper threshold value Von, so that no address event is detected. Thus, in a result of detection of an address event, noise due to the dark current can be reduced.

Furthermore, in a case where the amount of light is greater than Pmin, the conversion target current Ip' depending on the amount of light is converted into the pixel voltage Vp of the logarithmic value of the conversion target current Ip'. For example, the amounts of light P3 to P6 are converted into pixel voltages V3 to V6. Then, when the amount of light changes from P3 to P4, the pixel voltage also changes from V3 to V4, and a differential signal indicating an amount of change dV2 is output. Furthermore, when the amount of light changes from P5 to P6, the pixel voltage also changes from V5 to V6, and a differential signal indicating an amount of change dV3 is output. When these amounts of change exceed the upper threshold value Von, an ON event is detected.

On the other hand, in the comparative example, the conversion target current Ip' is not limited and is directly converted into the pixel voltage Vp. For example, when the amount of light of weak light changes from P1 to P2, the pixel voltage also changes from V1 to V2. Then, when a differential signal indicating an amount of change dV1 exceeds the upper threshold value Von, an ON event is detected. It is assumed that the dark current is dominant in the weak light having the amount of light of P1 or P2. For this reason, there is a possibility that the pixel voltage changes due to the fluctuation of the dark current and an address event is erroneously detected. This erroneous detection may cause noise in the result of the detection of the address event.

In the pixel 310 that limits the conversion target current Ip' and the comparative example that does not limit the conversion target current, the pixel 310 does not detect an address event with respect to a change in the weak light of less than the amount of light Pmin, whereas the comparative example detects an address event sometimes. For this reason, sensitivity to the weak light is higher in the comparative example. Instead, the pixel 310 does not erroneously detect an address event with respect to the fluctuation of the dark current, whereas the comparative example erroneously detects an address event sometimes. For this reason, the pixel 310 has higher resistance to the noise due to the dark current.

[Configuration Example of AER Logic Circuit]

Figure 7:
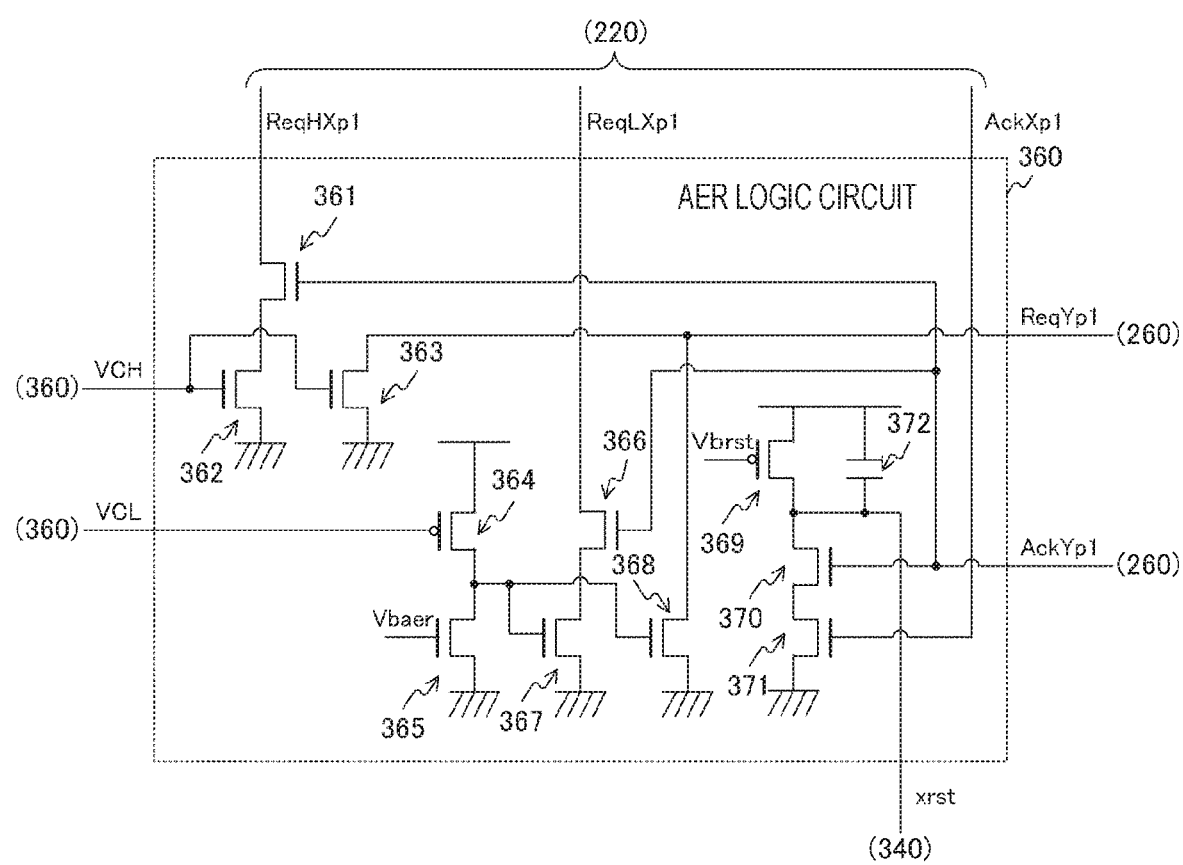
FIG. 7 is a circuit diagram illustrating a configuration example of an Address Event Representation (AER) logic circuit in the first embodiment of the present technology.

FIG. 7 is a block diagram illustrating a configuration example of the AER logic circuit 360 in the first embodiment of the present technology. The AER logic circuit 360 includes nMOS transistors 361 to 363, 365 to 368, 370, and 371, pMOS transistors 364 and 369, and a capacitance 372.

The nMOS transistors 361 and 362 are connected together in series. The comparison result VCH is input to the gates of the nMOS transistors 362 and 363, and a response AckYp1 is input to the gate of the nMOS transistor 361. Furthermore, the sources of the nMOS transistors 362 and 363 are grounded, and a request ReqHXp1 is output from the drain of the nMOS transistor 361 to the column AER circuit 220. A request ReqYp1 is output from the drain of the nMOS transistor 363 to the row AER circuit 260.

The pMOS transistor 364 and the nMOS transistor 365 are connected in series between the power supply and the ground terminal. Furthermore, the comparison result VCL is input to the gate of the pMOS transistor 364, and a bias voltage Vbaer is applied to the gate of the nMOS transistor 365.

The nMOS transistors 366 and 367 are connected together in series. The gates of the nMOS transistors 367 and 368 are connected to a connection point between the pMOS transistor 364 and the nMOS transistor 365. The response AckYp1 is input to the gate of the nMOS transistor 366. Furthermore, the sources of the nMOS transistors 367 and 368 are grounded, and a request ReqLXp1 is output from the drain of the nMOS transistor 366 to the column AER circuit 220. The request ReqYp1 is output from the drain of the nMOS transistor 368 to the row AER circuit 260.

The pMOS transistor 369 and the nMOS transistors 370 and 371 are connected in series between the power supply and the ground terminal. Furthermore, a bias voltage Vbrst is applied to the gate of the pMOS transistor 369. The response AckYp1 is input to the gate of the nMOS transistor 370, and a response AckXp1 is input to the gate of the nMOS transistor 371. One end of the capacitance 372 is connected to the power supply, and the other end is connected to a connection point between the pMOS transistor 369 and the nMOS transistor 370. Furthermore, a voltage at the connection point between the pMOS transistor 369 and the nMOS transistor 370 is output to the differentiating circuit 340 as the reset signal xrst.

With the above-described configuration, when the comparison result VCH at the high level is input (that is, an ON event is detected), the AER logic circuit 360 transmits the request ReqYp1 at the low level to the row AER circuit 260. Then, when the response AckYp1 at the high level is received from the row AER circuit 260, the AER logic circuit 360 transmits the request ReqHXp1 at the low level to the column AER circuit 220. Subsequently, upon receiving the response AckXp1 at the high level from the column AER circuit 220, the AER logic circuit 360 outputs the reset signal xrst at the low level to the differentiating circuit 340.

Furthermore, when the comparison result VCL at the low level is input (that is, an OFF event is detected), the AER logic circuit 360 transmits the request ReqYp1 to the row AER circuit 260. Then, upon receiving the response AckYp1 at the high level from the row AER circuit 260, the AER logic circuit 360 transmits the request ReqLXp1 at the low level to the column AER circuit 220. Subsequently, upon receiving the response AckXp1 at the high level from the column AER circuit 220, the AER logic circuit 360 outputs the reset signal xrst at the low level to the differentiating circuit 340.

[Configuration Example of Row AER Circuit]

Figure 8:
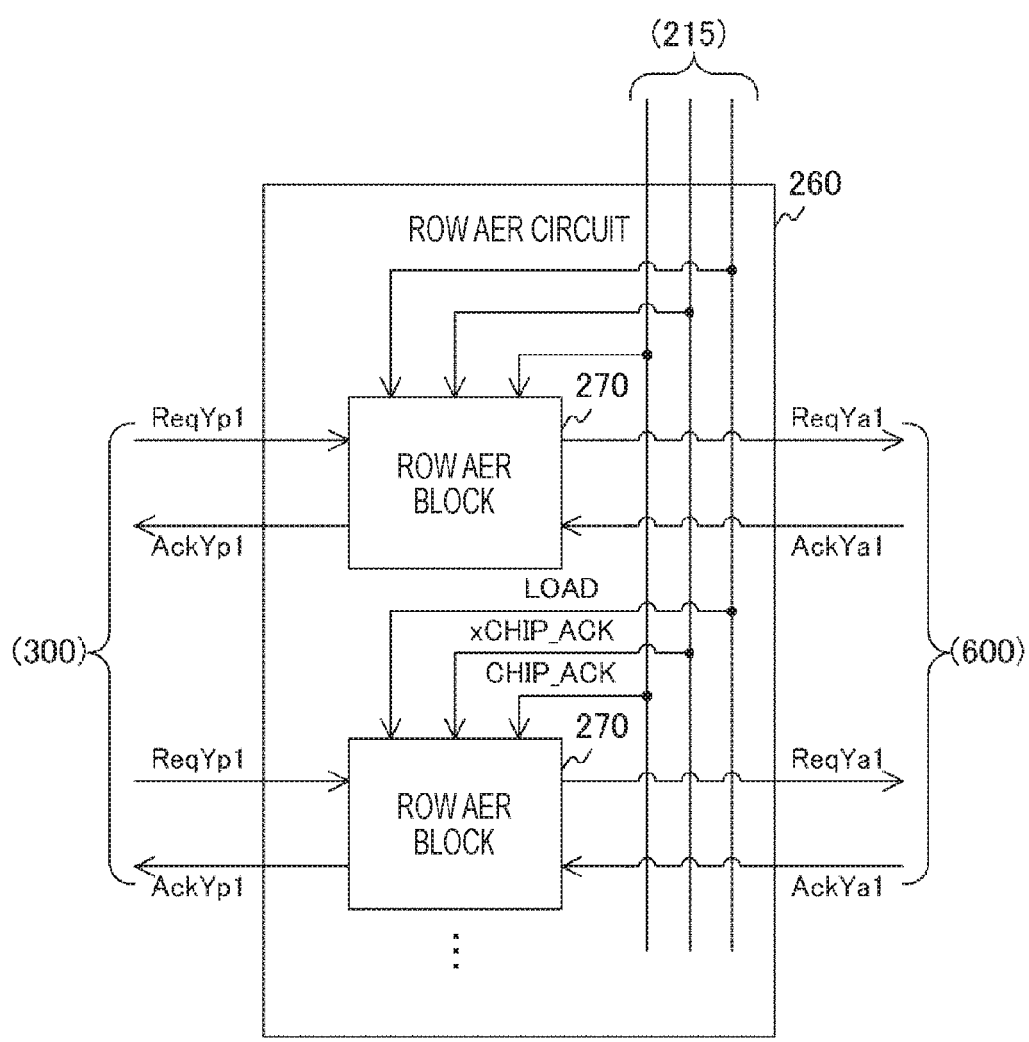
FIG. 8 is a block diagram illustrating a configuration example of a row AER circuit in the first embodiment of the present technology.

FIG. 8 is a block diagram illustrating a configuration example of the row AER circuit 260 in the first embodiment of the present technology. The row AER circuit 260 includes a row AER block 270 for each row. The row AER block 270 performs handshaking between the corresponding row, the row arbiter 600, and the state machine 215.

[Configuration Example of Row AER Block]

Figure 9:
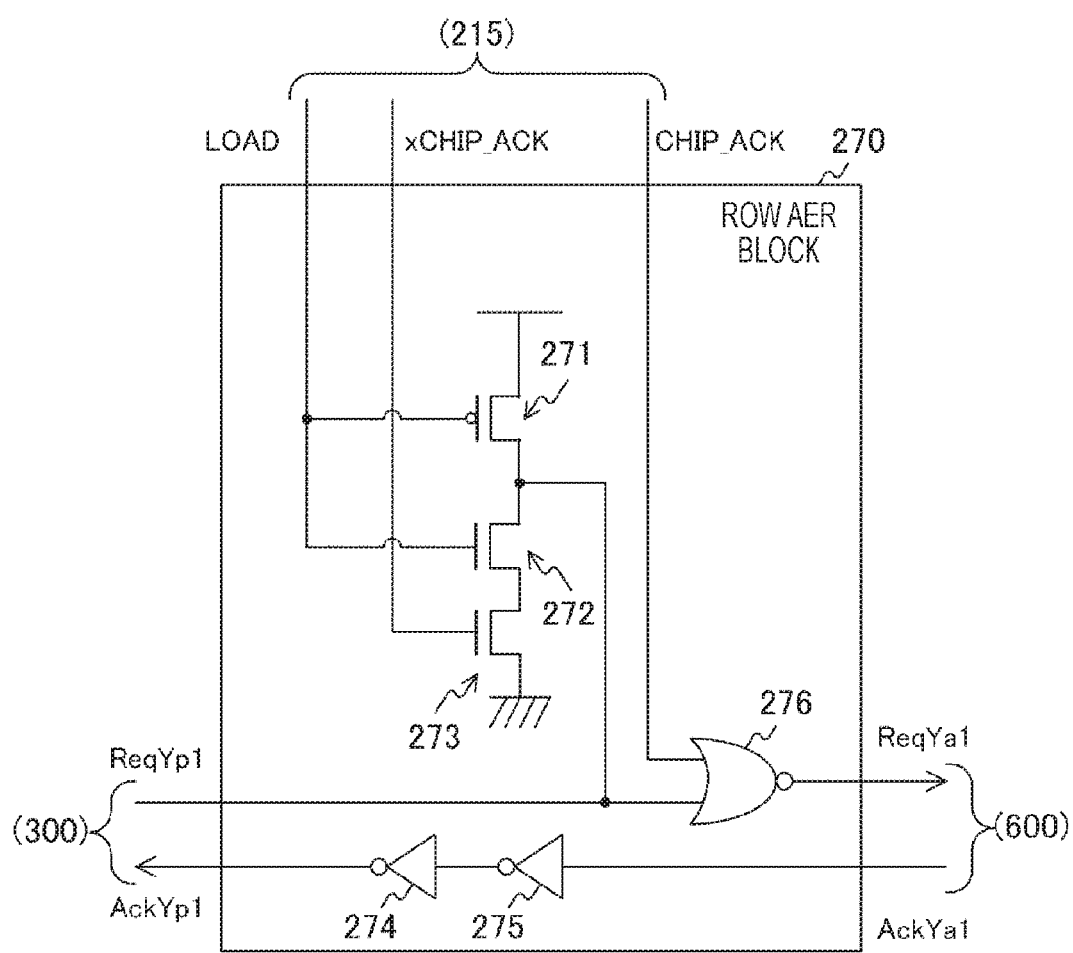
FIG. 9 is a circuit diagram illustrating a configuration example of a row AER block in the first embodiment of the present technology.

FIG. 9 is a circuit diagram illustrating a configuration example of the row AER block 270 in the first embodiment of the present technology. The row AER block 270 includes a pMOS transistor 271, nMOS transistors 272 and 273, a NOR gate 276, and inverters 274 and 275.

The pMOS transistor 271 and the nMOS transistors 272 and 273 are connected in series between the power supply and the ground terminal. Furthermore, a control signal LOAD from the state machine 215 is input to the gates of the pMOS transistor 271 and the nMOS transistor 272. The control signal LOAD is a signal for giving an instruction of reading a result of detection of an address event. Furthermore, xCHIP_ACK obtained by inverting a response CHIP_ACK from the state machine 215 is input to the gate of the nMOS transistor 273.

The NOR gate 276 outputs the NOR of two input values to the row arbiter 600 as a request ReqYa1. The response CHIP_ACK from the state machine 215 is input to one of input terminals of the NOR gate 276. The other of the input terminals of the NOR gate 276 is connected to a connection point between the pMOS transistor 271 and the nMOS transistor 272, and a signal line that transmits the request ReqYp1 from the pixel array unit 300.

The inverter 275 inverts a response AckYa1 from the row arbiter 600 and outputs a signal obtained to the inverter 274. The inverter 274 inverts the signal from the inverter 275 and outputs a signal obtained to the pixel array unit 300 as a response AckYp1.

With the above-described configuration, when the request ReqYp1 at the low level is input, the row AER block 270 outputs the request ReqYa1 if the response CHIP_ACK is at the high level. Furthermore, the row AER block 270 delays and outputs the response AckYa1 at the high level as the response AckYp1.

[Configuration Example of Column AER Circuit]

Figure 10:
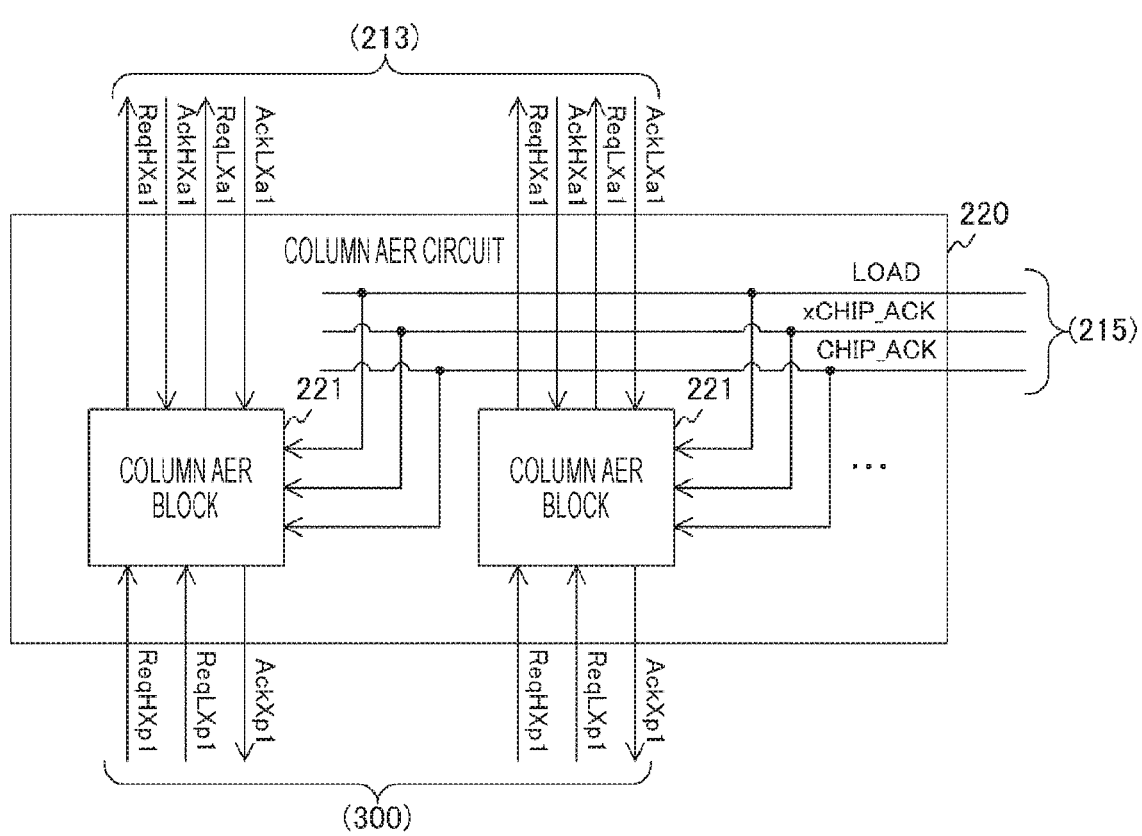
FIG. 10 is a block diagram illustrating a configuration example of a column AER circuit in the first embodiment of the present technology.

FIG. 10 is a block diagram illustrating a configuration example of the column AER circuit 220 in the first embodiment of the present technology. The column AER circuit 220 includes a column AER block 221 for each column. The column AER block 221 performs handshaking between the corresponding column, the state machine 215, and the column arbiter 213.

[Configuration Example of Column AER Block]

Figure 11:
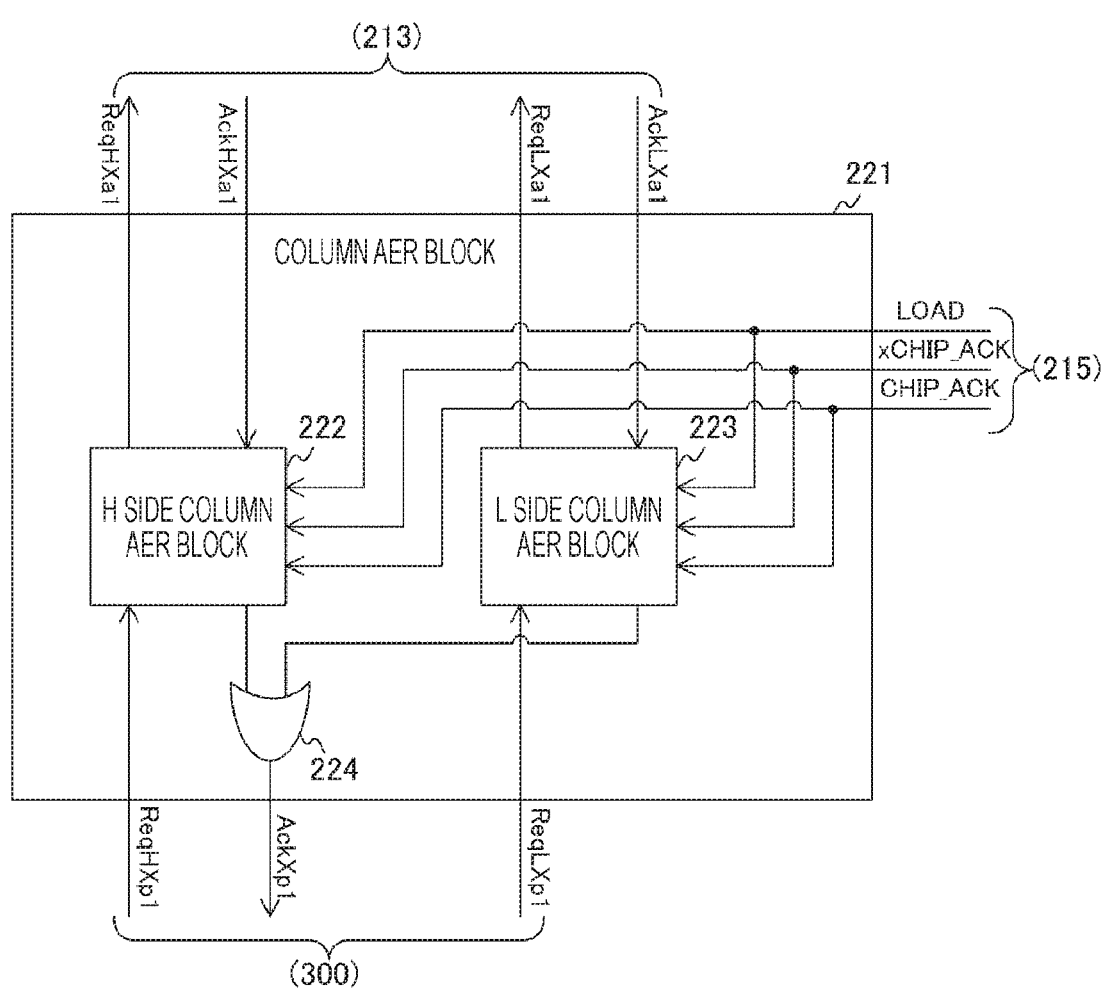
FIG. 11 is a block diagram illustrating a configuration example of a column AER block in the first embodiment of the present technology.

FIG. 11 is a block diagram illustrating a configuration example of the column AER block 221 in the first embodiment of the present technology. The column AER block 221 includes an H side column AER block 222, an L side column AER block 223, and an OR gate 224.

The H side column AER block 222 performs handshaking when the request ReqHXp1 at the low level is input. The H side column AER block 222 outputs a signal obtained by delaying a response AckHXa1 at the high level to the OR gate 224. The L side column AER block 223 performs handshaking when the request ReqLXp1 at the low level is input. The L side column AER block 223 outputs a signal obtained by delaying a response AckLXa1 at the high level to the OR gate 224. Furthermore, the H side column AER block 222 and the L side column AER block 223 invert the requests at the low level from the pixel array unit 300. The configuration of the H side column AER block 222 and the L side column AER block 223 is similar to that of the row AER block 270 illustrated in FIG. 9. Note that, the configuration of the AER blocks for rows and columns is not limited to the circuit illustrated in FIG. 9 as long as handshaking can be performed.

The OR gate 224 outputs the OR of signals from the H side column AER block 222 and the L side column AER block 223 as the response AckXp1.

[Configuration Example of Row Arbiter]

Figure 12:
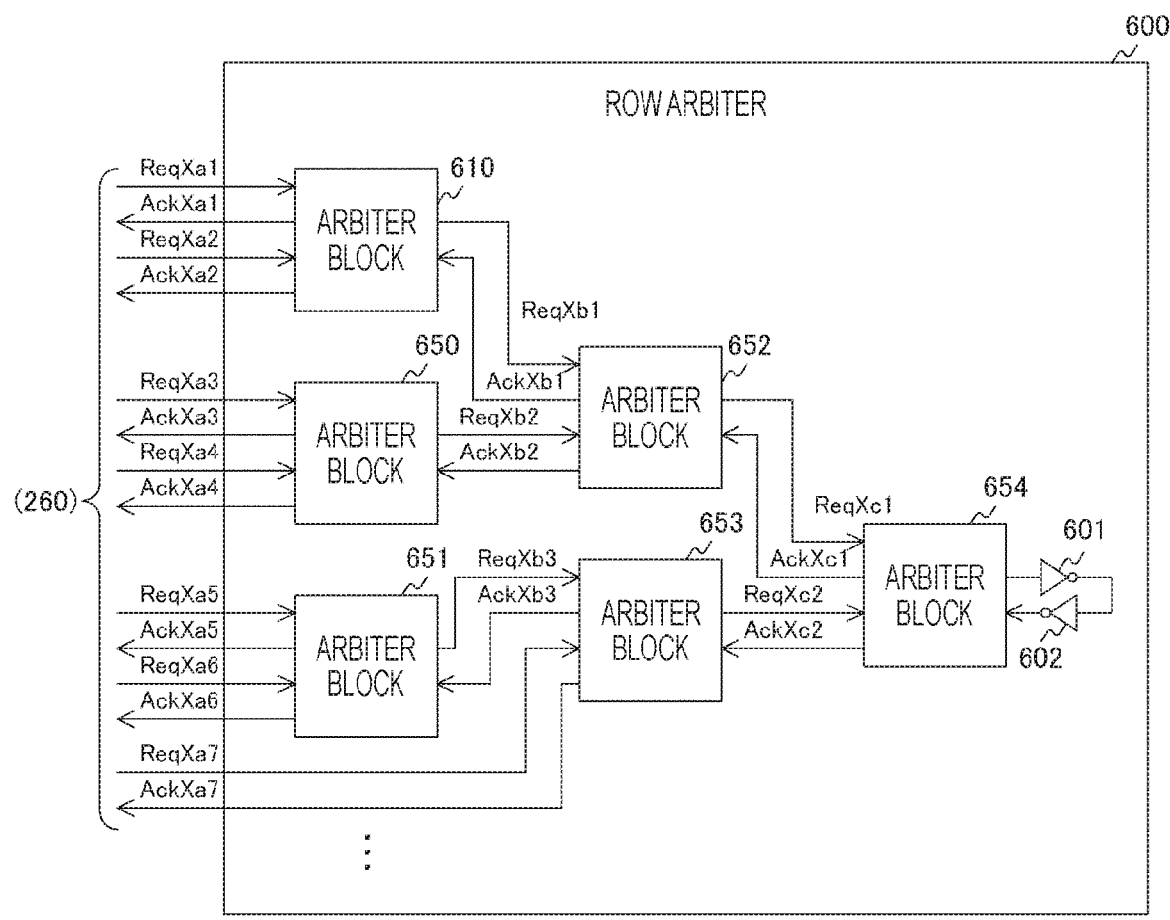
FIG. 12 is a block diagram illustrating a configuration example of a row arbiter in the first embodiment of the present technology.

FIG. 12 is a block diagram illustrating a configuration example of the row arbiter 600 in the first embodiment of the present technology. The row arbiter 600 includes arbiter blocks 610, 650 to 654 and inverters 601 and 602 every seven rows. Note that, the figure is a diagram in a case where the number of vertical event driven pixels is seven pixels. For example, if the number of vertical event driven pixels is 1000 pixels, 10 stages of arbiters are provided to cover up to 2^10 stages (=1024 pixels).

The arbiter block 610 arbitrates between a request from the first row and a request from the second row. The arbiter block 610 performs handshaking with the arbiter block 652, and outputs a response to the first or second row on the basis of the arbitration result.

The arbiter block 650 arbitrates between a request from the third row and a request from the fourth row. The arbiter block 650 performs handshaking with the arbiter block 652, and outputs a response to the third or fourth row on the basis of the arbitration result.

The arbiter block 651 arbitrates between a request from the fifth row and a request from the sixth row. The arbiter block 651 performs handshaking with the arbiter block 653, and outputs a response to the fifth or sixth row on the basis of the arbitration result.

The arbiter block 652 arbitrates between a request from the arbiter block 610 and a request from the arbiter block 650. The arbiter block 652 performs handshaking with the arbiter block 654, and outputs a response to the arbiter block 610 or 650 on the basis of the arbitration result.

The arbiter block 653 arbitrates between a request from the arbiter block 651 and a request from the seventh row. The arbiter block 653 performs handshaking with the arbiter block 654, and outputs a response to the arbiter block 651 or the seventh row on the basis of the arbitration result.

The arbiter block 654 arbitrates between a request from the arbiter block 652 and a request from the arbiter block 653. The arbiter block 654 delays the response to the earlier request with the inverters 601 and 602, and supplies the delayed response to the arbiter block 652 or 653.

Note that, the configuration of the column arbiter 213 is similar to that of the row arbiter 600. Furthermore, the configuration of these arbiters is not limited to the configuration illustrated in the figure as long as requests can be arbitrated.

[Configuration Example of Arbiter Block]

Figure 13:
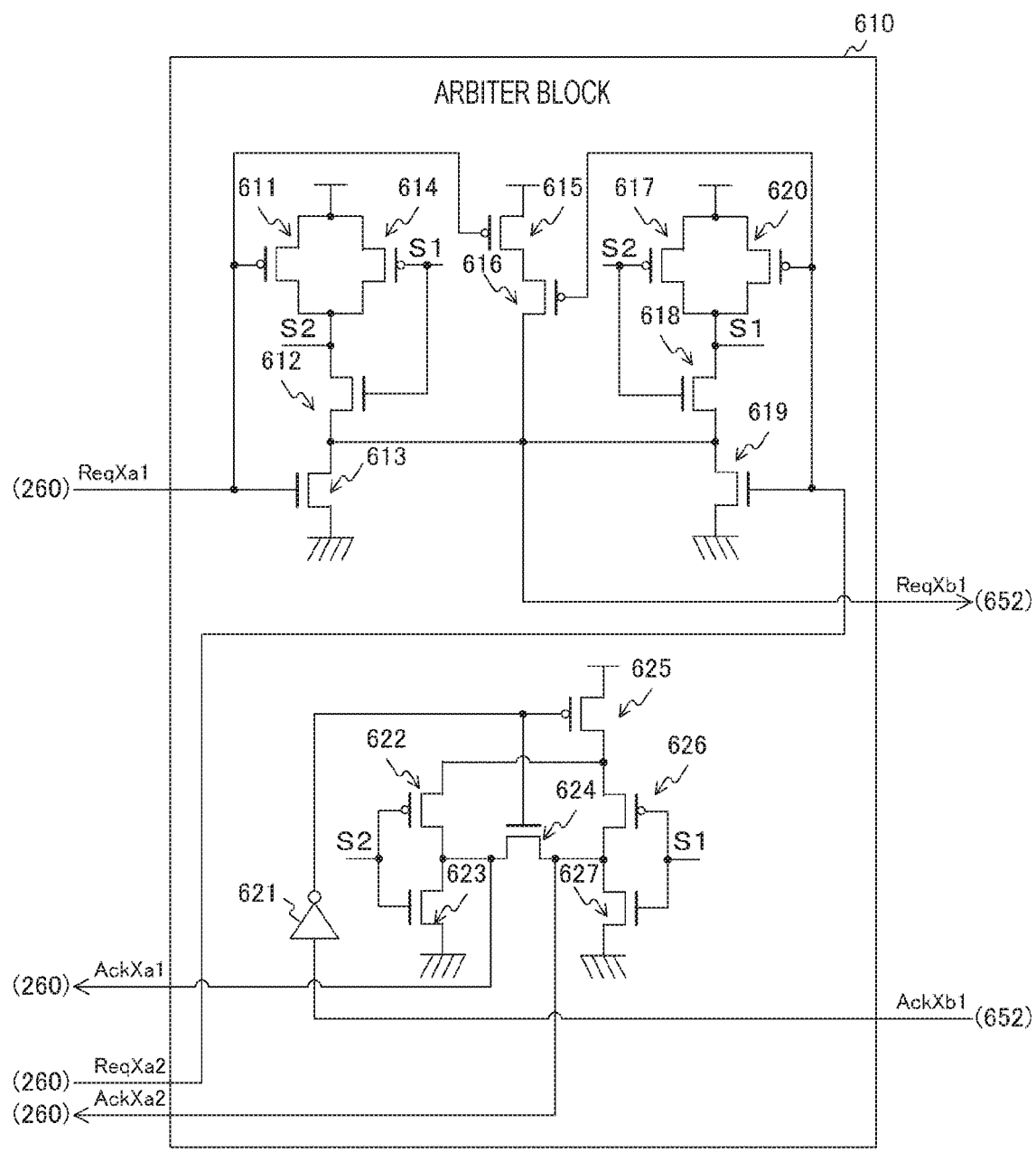
FIG. 13 is a circuit diagram illustrating a configuration example of an arbiter block in the first embodiment of the present technology.

FIG. 13 is a circuit diagram illustrating a configuration example of the arbiter block 610 in the first embodiment of the present technology. The arbiter block 610 includes pMOS transistors 611, 614, 615 to 617, 620, 622, 625, and 626, nMOS transistors 612, 613, 618, 619, 623, 624, and 627, and an inverter 621.

The pMOS transistors 611 and 614 are connected in parallel to the power supply. The nMOS transistors 612 and 613 are connected in series between the ground terminal and the drains of the pMOS transistors 611 and 614. Furthermore, a request ReqXa1 from the first row is input to the gates of the pMOS transistor 611 and the nMOS transistor 613.

The pMOS transistors 615 and 616 are connected in series to the power supply. Furthermore, the request ReqXa1 is input to the gate of the pMOS transistor 615, and a request ReqXa2 from the second row is input to the gate of the pMOS transistor 616.

The pMOS transistors 617 and 620 are connected in parallel to the power supply. The nMOS transistors 618 and 619 are connected in series between the ground terminal and the drains of the pMOS transistors 617 and 620. Furthermore, the gates of the pMOS transistor 617 and the nMOS transistor 618 are connected to the drains of the pMOS transistors 611 and 614. The request ReqXa2 is input to the gates of the pMOS transistor 620 and the nMOS transistor 619. The drains of the pMOS transistors 617 and 620 are connected to the gates of pMOS transistor 614 and nMOS transistor 612.

Furthermore, a connection point between the nMOS transistors 612 and 613, the drain of the pMOS transistor 616, and a connection point between the nMOS transistors 618 and 619 are connected to a signal line that transmits a request ReqXb1. The request ReqXb1 is output to the arbiter block 652 of the upper level.

The inverter 621 inverts a response AckXb1 from the arbiter block 652 of the upper level. The inverter 621 outputs the inverted signal to the gates of the pMOS transistor 625 and the nMOS transistor 624.

The pMOS transistors 625 and 626 and the nMOS transistor 627 are connected in series between the power supply and the ground terminal. Furthermore, the pMOS transistor 622 and the nMOS transistor 623 are connected in series between the ground terminal and a connection point between the pMOS transistors 625 and 626. The source and the drain of the nMOS transistor 624 are connected to a connection point between the pMOS transistor 622 and the nMOS transistor 623 and a connection point between the pMOS transistor 626 and the nMOS transistor 627.

Furthermore, the gates of the pMOS transistor 622 and the nMOS transistor 623 are connected to the drains of the pMOS transistors 611 and 614. The gates of the pMOS transistor 626 and the nMOS transistor 627 are connected to the drains of the pMOS transistors 617 and 620. The connection point between the pMOS transistor 622 and the nMOS transistor 623 is connected to a signal line that transmits a response AckXa1 to the first row. The connection point between the pMOS transistor 626 and the nMOS transistor 627 is connected to a signal line that transmits a response AckXa2 to the second row.

With the above-described configuration, upon receiving the request ReqXa1 or the request ReqXa2, the arbiter block 610 outputs the request ReqXb1. Then, upon receiving the response AckXb1, the arbiter block 610 outputs a response corresponding to the earlier arrival of the request ReqXa1 and the request ReqXa2.

Note that, the configuration of the arbiter blocks 650 to 654 is similar to that of the arbiter block 610 illustrated in the figure.

Figure 14:
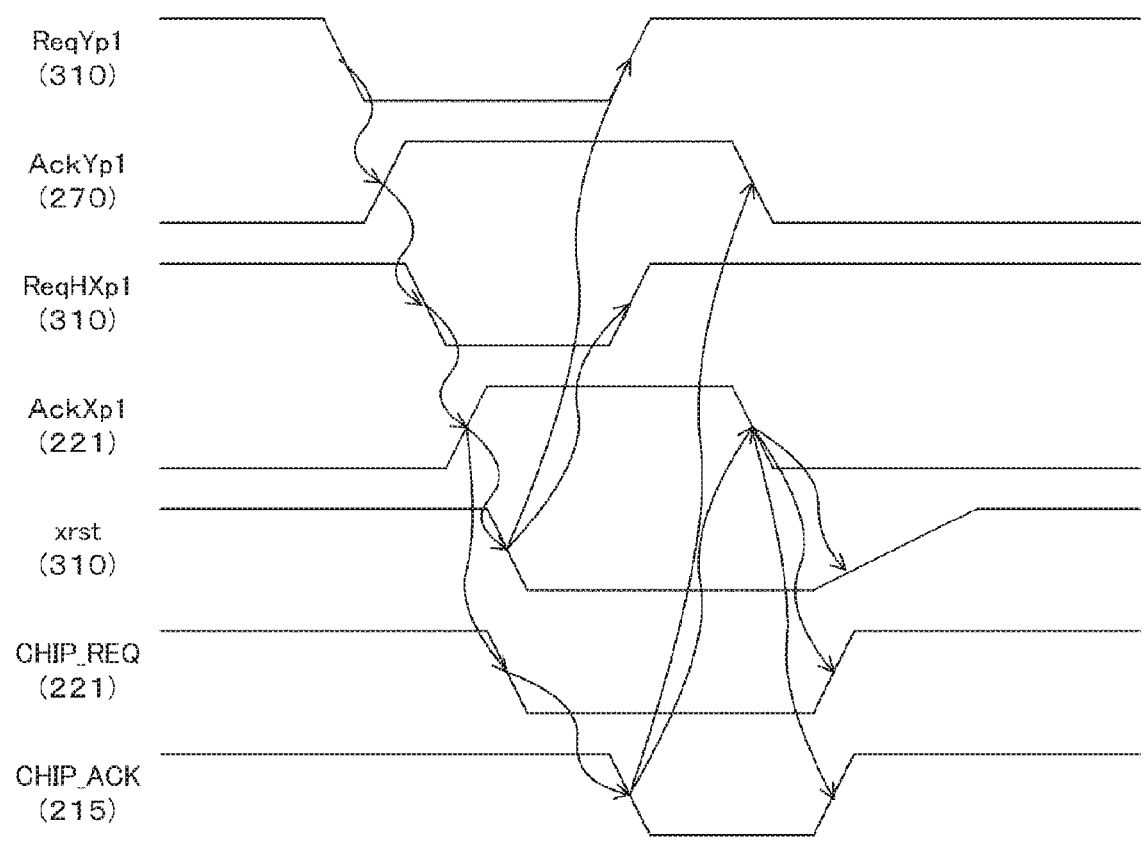
FIG. 14 is a timing chart illustrating an example of handshaking in the first embodiment of the present technology.

FIG. 14 is a timing chart illustrating an example of handshaking in the first embodiment of the present technology. When the pixel 310 outputs the request ReqYp1 at the low level, the row AER block 270 returns the response AckYp1 at the high level if the response CHIP_ACK is at the high level.

Upon receiving the response AckYp1, the pixel 310 outputs the request ReqHXp1 at the low level in a case where an ON event occurs. Note that, in a case where an OFF event occurs, the request ReqLXp1 at the low level is output.

Upon receiving the request ReqHXp1, the column AER block 221 returns the response AckXp1 at the high level if the response CHIP_ACK is at the high level. Upon receiving the response AckXp1, the pixel 310 generates the reset signal xrst at the low level to initialize the requests ReqYp1 and ReqHXp1 to the high level.

Furthermore, when the response AckXp1 is output, the column AER block 221 outputs a request CHIP_REQ at the low level. Upon receiving the request CHIP_REQ, the state machine 215 transfers a result of detection of an address event to the DSP circuit 120, and returns the response CHIP_ACK at the low level.

Upon receiving the response CHIP_ACK, the row AER block 270 initializes the response AckYp1 to the low level if the request ReqYp1 is at the high level. Furthermore, upon receiving the response CHIP_ACK, the column AER block 221 initializes the response AckXp1 to the low level if the request ReqHXp1 is at the high level.

When the response AckXp1 is initialized, the pixel 310 initializes the reset signal xrst to the high level, and the column AER block 221 initializes the request CHIP_REQ to the high level. Furthermore, the state machine 215 initializes the response CHIP_ACK to the high level.

[Operation Example of Solid-State Imaging Element]

Figure 15:
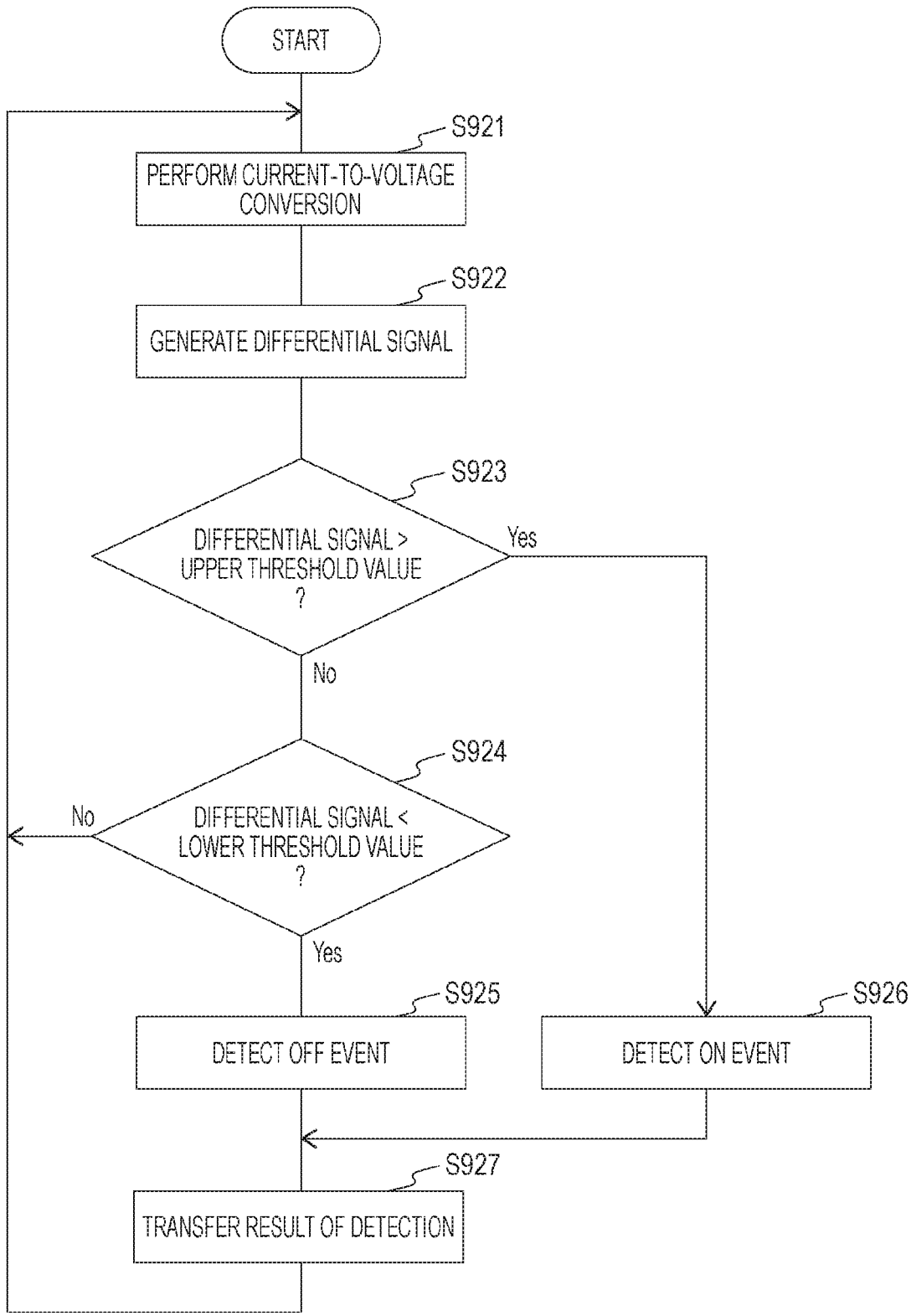
FIG. 15 is a flowchart illustrating an example of operation of AER processing in the first embodiment of the present technology.

FIG. 15 is a flowchart illustrating an example of AER processing in the first embodiment of the present technology. The AER processing is started, for example, when a predetermined application for detecting an address event is executed.

The pixel 310 performs initialization with the reset signal xrst or the like (step S920). Then, the logarithmic response unit 320 and the buffer 330 in the pixel 310 convert the conversion target current Ip' limited to the range greater than or equal to the offset current Iofs into a pixel voltage (step S921). The differentiating circuit 340 generates a differential signal from the pixel voltage (step S922), and the comparator 350 determines whether or not the differential signal exceeds the upper threshold value Von (step S923). In a case where the differential signal exceeds the upper threshold value Von (step S923: Yes), the pixel 310 detects an ON event (step S926).

On the other hand, in a case where the differential signal is less than or equal to the upper threshold value Von (step S923: No), the comparator 350 determines whether or not the differential signal falls below the lower threshold value Voff (step S924). In a case where the differential signal falls below the lower threshold value Voff (step S924: Yes), the pixel 310 detects an OFF event (step S925). In a case where the differential signal is greater than or equal to the lower threshold value Voff (step S924: No), the pixel 310 repeatedly executes step S921 and the subsequent steps. Furthermore, after step S925 or S926, the pixel 310 transfers a result of detection by handshaking (step S927) and performs initialization (step S928). Then, the pixel 310 repeatedly executes step S921 and subsequent steps.

As described above, according to the first embodiment of the present technology, the pixel 310 detects an address event by limiting the current to the range greater than or equal to the offset current, so that erroneous detection can be reduced when the dark current less than the offset current occurs. Thus, in a result of detection of an address event, noise due to the dark current can be reduced.

2. Second Embodiment

In the above-described first embodiment, the drain current of the nMOS transistor 321 is used as the offset current Iofs, but with this configuration, it is difficult to finely adjust the value of the offset current Iofs. A pixel 310 of this second embodiment differs from the first embodiment in that the offset current is statically changed by a current splitter.

Figure 16:
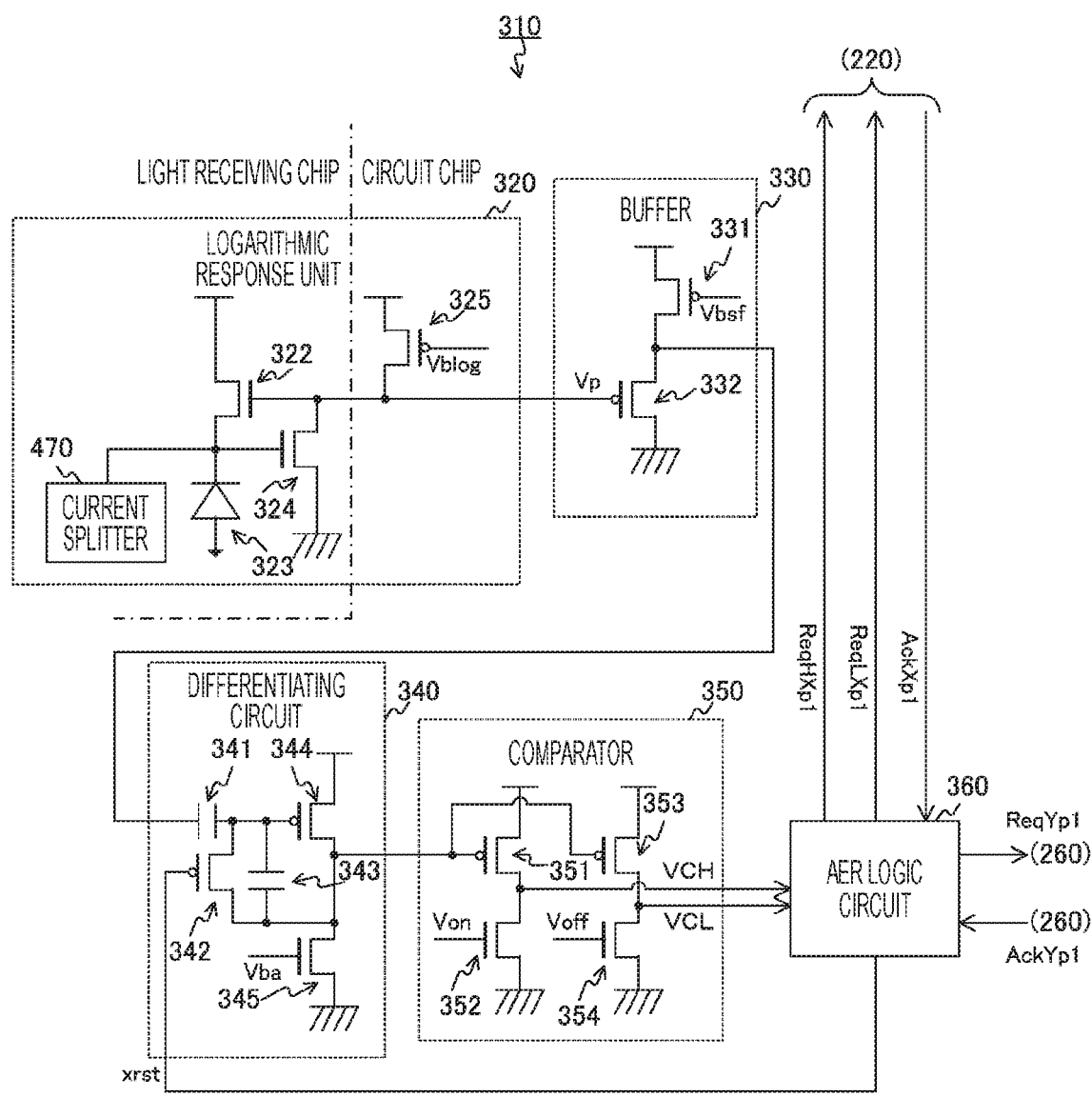
FIG. 16 is a circuit diagram illustrating a configuration example of a pixel in a second embodiment of the present technology.

FIG. 16 is a circuit diagram illustrating a configuration example of the pixel 310 in the second embodiment of the present technology. The pixel 310 according to the second embodiment differs from the first embodiment in that a current splitter 470 is provided instead of the nMOS transistor 321.

Figure 17:
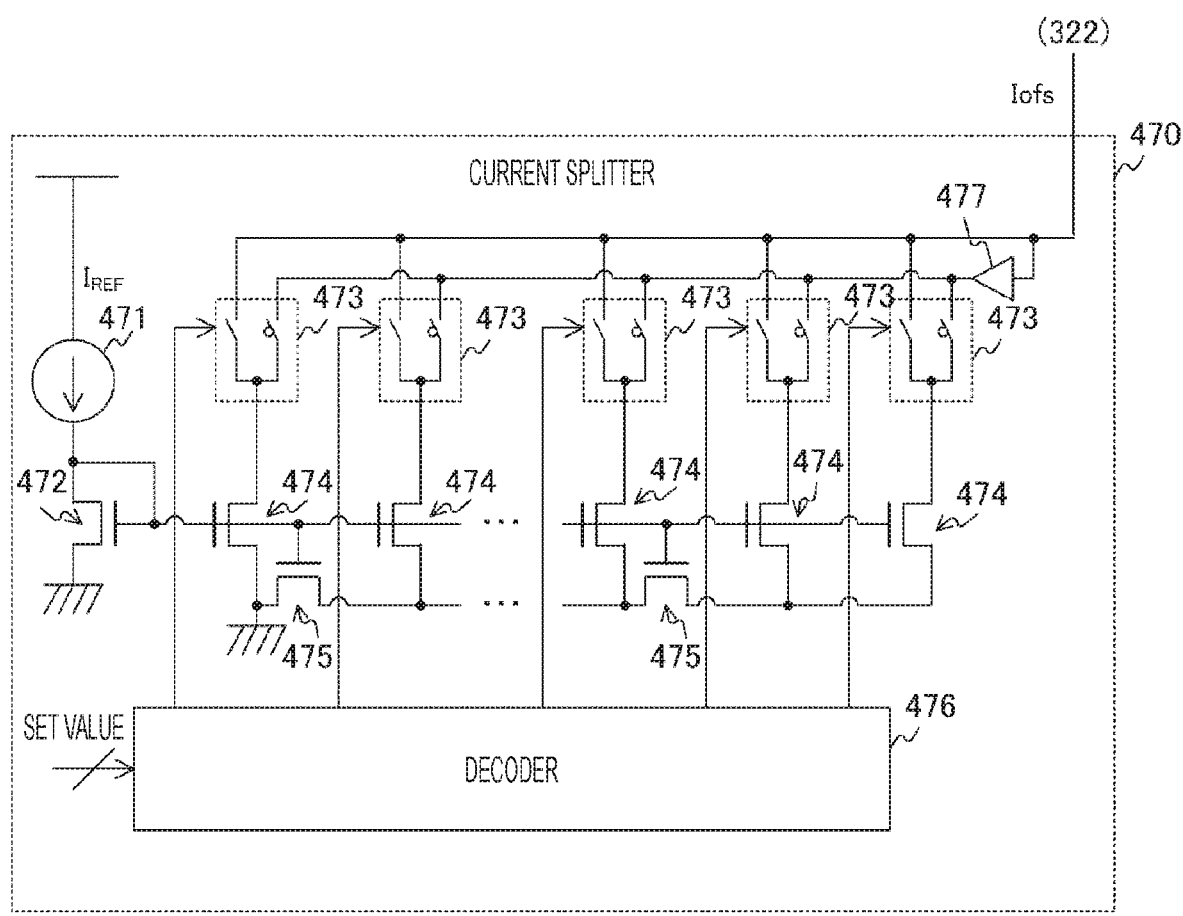
FIG. 17 is a circuit diagram illustrating a configuration example of a current splitter in the second embodiment of the present technology.

FIG. 17 is a circuit diagram illustrating a configuration example of the current splitter 470 in the second embodiment of the present technology. The current splitter 470 includes a reference current source 471, an nMOS transistor 472, m+1 switches 473, m+1 nMOS transistors 474, m−1 nMOS transistors 475, a decoder 476, and a buffer 477.

The reference current source 471 generates and supplies a predetermined reference current $I_{REF}$ to the drain of the nMOS transistor 472.

The drain and gate of the nMOS transistor 472 are short-circuited, and the source is grounded.

The switches 473 are respectively associated with the nMOS transistors 474 different from each other. Each switch 473 connects the drain of the corresponding transistor to either the buffer 477 or the nMOS transistor 322 as an output destination in accordance with the control of the decoder 476.

The gates of the respective nMOS transistors 474 are connected to the gate of the nMOS transistor 472. Furthermore, the sources of the respective nMOS transistors 474 are commonly connected to the ground terminal.

The gates of the respective nMOS transistors 475 are connected to the gate of the nMOS transistor 472. Furthermore, the drain and source of the m-th nMOS transistor 475 are respectively connected to the sources of the m-th and (m+1)-th nMOS transistors 474.

The decoder 476 controls each of the switches 473 in accordance with a predetermined set value held in advance in a register or the like.

The input terminal of the buffer 477 is connected to the nMOS transistor 322 as the output destination, and the output terminal is connected to each of the switches 473.

The nMOS transistors 474 respectively form current mirror circuits with the nMOS transistor 472. These current mirror circuits can generate a plurality of distribution currents by distributing the reference current $I_{REF}$ at distribution ratios depending on the gate widths and gate lengths of the respective transistors. Note that, a circuit including m+1 switches 473, m+1 nMOS transistors 474, and m−1 nMOS transistors 475 is an example of a distribution circuit described in the claims.

For example, a gate width W and a gate length L of each of the nMOS transistor 472 and the first to m-th nMOS transistors 474 are set to values satisfying the following equation.

$$W/L = (N-1) \times \alpha \qquad \text{Equation 1}$$

The gate width W and the gate length L of the (m+1)-th nMOS transistor 472 are set to values satisfying the following equation.

$$W/L = \alpha \qquad \text{Equation 2}$$

Furthermore, the gate width W and the gate length L of the nMOS transistor 475 are set to values satisfying the following equation.

$$W/L = N \times \alpha/(N-1) \quad \text{Equation 3}$$

In a case where the gate widths W and the gate lengths L satisfying Expressions 1 to 3 are set, a distribution current $I_m$ flowing through the first to m-th nMOS transistors 472 is expressed by the following expression.

$$I_m = I_{REF}/Nm-1 \quad \text{Equation 4}$$

Furthermore, a distribution current $I_{m+1}$ flowing through the (m+1)-th nMOS transistor 472 is expressed by the following equation.

$$I_{m+1} = I_{REF}/\{Nm-1(N-1)\} \quad \text{Equation 5}$$

The decoder 476 controls a connection destination of the switch 473 in accordance with the set value, whereby the offset current Iofs can be controlled on the order of sub-picoampere on the basis of Equations 4 and 5. For example, in a case where connection destinations of the first and (m+1)-th switches 473 are set to the output side and others are set to the buffer 477 side, the offset current Iofs can be controlled to the sum of the distribution currents $I_1$ and $I_{m+1}$. Changing the set value to the decoder 476 is performed while imaging operation in the solid-state imaging element 200 is stopped. That is, the offset current Iofs is a statically variable value.

Note that, the decoder 476 is an example of a decoder in the claims. Furthermore, the configuration of the current splitter 470 is not limited to the circuit illustrated in the figure as long as the offset current Iofs can be changed by updating the set value. Furthermore, although the output terminal of the current splitter 470 is directly connected to the nMOS transistor 322, the output terminal can be connected via a current mirror circuit.

As described above, according to the second embodiment of the present technology, the offset current can be changed by the set value to the decoder 476, so that fine adjustment of the offset current is facilitated.

Note that, in FIG. 17, the reference current source 471 that generates $I_{REF}$ and the nMOS transistor 472 can be a common circuit for all pixels, and the rest can be arranged in the current splitter 470 for each pixel. Furthermore, in addition to the reference current source 471 and the nMOS transistor 472, the decoder 476 can be a common circuit for all pixels.

3. Third Embodiment

In the above-described first embodiment, the drain current of the nMOS transistor 321 is used as the offset current Iofs, but with this configuration, it is difficult to finely adjust the value of the offset current Iofs. A solid-state imaging element 200 according to this third embodiment differs from the first embodiment in that the offset current Iofs is dynamically changed.

Figure 18:
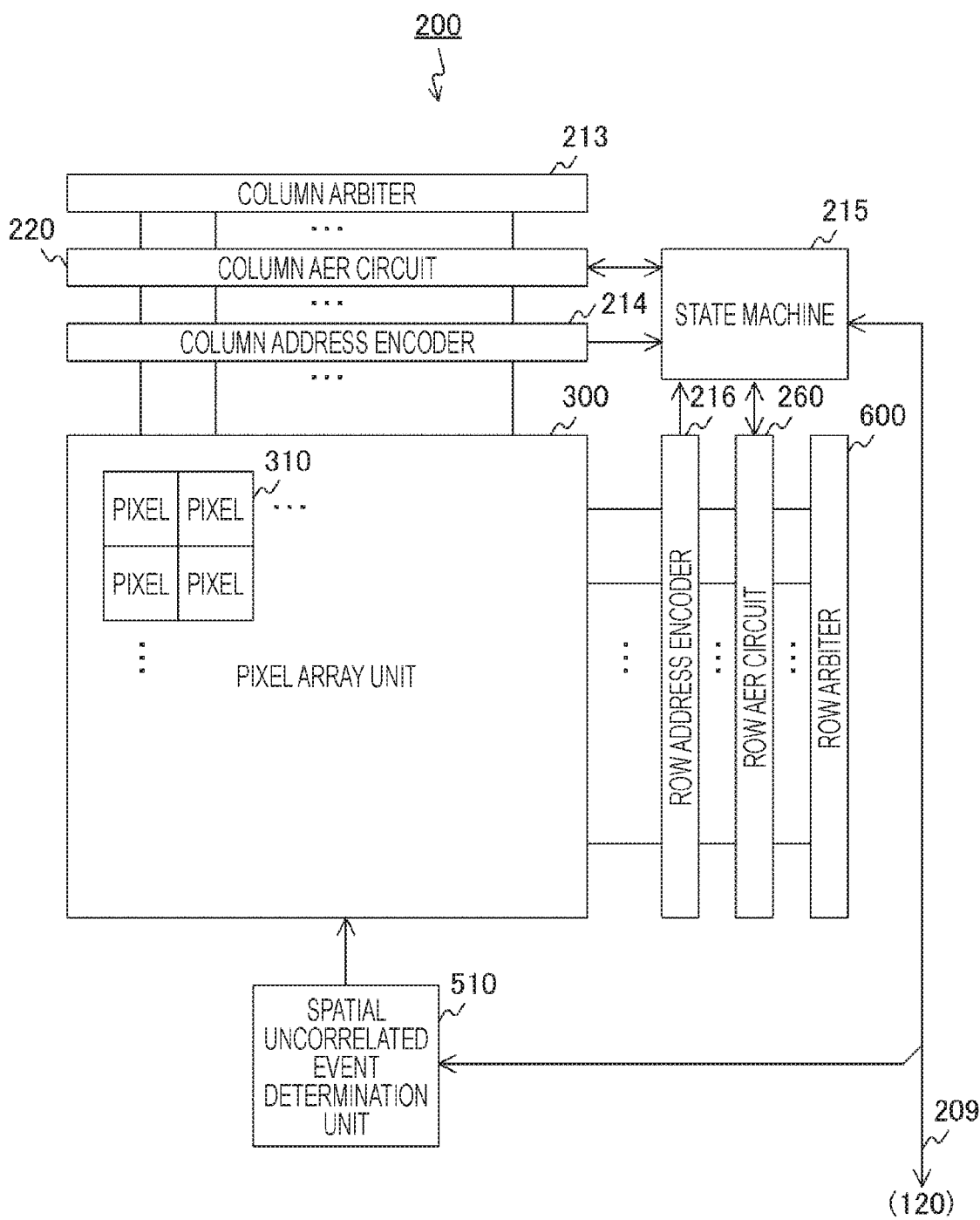
FIG. 18 is a block diagram illustrating a configuration example of a solid-state imaging element in a third embodiment of the present technology.

FIG. 18 is a block diagram illustrating a configuration example of the solid-state imaging element 200 in the third embodiment of the present technology. The solid-state imaging element 200 according to the third embodiment differs from the first embodiment in that a spatial uncorrelated event determination unit 510 is further included.

The spatial uncorrelated event determination unit 510 determines whether or not there is a correlation between a space around a pixel where an address event is detected and the address event. Generally, random noise due to a dark current has a poor correlation with the surrounding space. On the other hand, an address event due to a change in an amount of light often has a high correlation with the surrounding space. For example, when an object moves, the amount of light of a contour (edge) of the object changes, and a dress event is often detected near the edge. That is, in a case where an edge is detected in a space around a pixel where an address event is detected, there is a high possibility that the address event is not noise. Thus, the spatial uncorrelated event determination unit 510 controls the offset current Iofs on the basis of a degree of correlation with the space around the pixel where the address event is detected.

Figure 19:
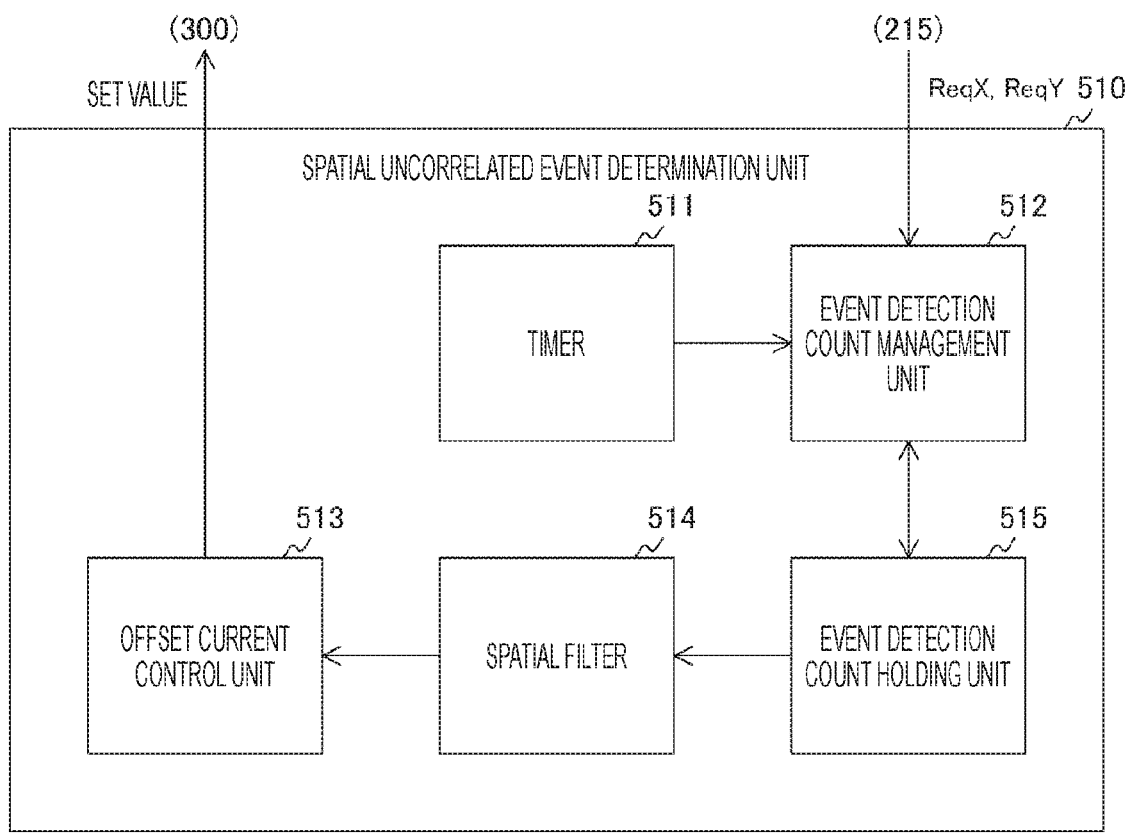
FIG. 19 is a block diagram illustrating a configuration example of a spatial uncorrelated event determination unit in the third embodiment of the present technology.

FIG. 19 is a block diagram illustrating a configuration example of the spatial uncorrelated event determination unit 510 in the third embodiment of the present technology. The spatial uncorrelated event determination unit 510 includes a timer 511, an event detection count management unit 512, an offset current control unit 513, a spatial filter 514, and an event detection count holding unit 515.

The timer 511 measures time in synchronization with a synchronization signal such as a clock signal until a predetermined set time has elapsed. The timer 511 supplies a timer value indicating the measured time to the event detection count management unit 512. Furthermore, when the set time has elapsed, the timer 511 resets the timer value to an initial value and repeats time measuring up to the set time.

The event detection count management unit 512 obtains for each address a detection count that an address event is detected within a certain period, and causes the event detection count holding unit 515 to hold the detection count. The event detection count management unit 512 receives requests ReqX and ReqY from the state machine 215. X and Y in these requests indicate the horizontal and vertical addresses of the pixel where the address event is detected.

When an address event is detected in a certain pixel, the event detection count management unit 512 reads the detection count of the pixel from the event detection count holding unit 515. Then, the event detection count management unit 512 increments the read detection count and updates the detection count with the value. Furthermore, when the timer value reaches the set time, the event detection count management unit 512 resets the detection count of all pixels to an initial value.

The event detection count holding unit 515 holds an address event detection count for each pixel.

The spatial filter 514 executes predetermined filter processing. The spatial filter 514 sequentially focuses on pixels, and reads the detection count of each of a pixel of interest that is focused and a pixel adjacent to the pixel of interest from the event detection count holding unit 515 as a pixel value. Here, "adjacent" means that a Euclidean distance to the pixel of interest is within a predetermined value. Then, the spatial filter 514 executes the predetermined filter processing on each of the read pixel values. For example, processing for detecting intensity of an edge is executed. The spatial filter 514 supplies an execution result (intensity of the edge or the like) of the processing to the offset current control unit 513 for each of the pixels.

The offset current control unit 513 controls the offset current Iofs on the basis of the processing result of the spatial filter 514. For example, for each pixel, the offset current control unit 513 reduces the offset current Iofs as the intensity of the edge detected around the pixel is higher (in other words, the correlation is higher). The control of the offset current Iofs is performed by changing the bias voltage Vsink.

Note that, the offset current control unit 513 controls the offset current Iofs by changing the bias voltage Vsink, but is not limited to this configuration. Similarly to the second embodiment, the current splitter 470 can be arranged in the pixel 310, and the offset current Iofs can be controlled by transmitting the set value to the decoder 476.

Furthermore, the offset current control unit 513 can forcibly change the offset current Iofs in accordance with user operation. In this case, for example, either a manual mode in which the user manually changes the offset current or an automatic mode in which the offset current control unit 513 dynamically changes the offset current is set in the offset current control unit 513. In the manual mode, the offset current control unit 513 changes the offset current Iofs in accordance with the user operation. On the other hand, in the automatic mode, the offset current control unit 513 changes the offset current Iofs on the basis of the processing result of the spatial filter 514.

As described above, according to the third embodiment of the present technology, the solid-state imaging element 200 changes the offset current on the basis of the processing result of the spatial filter 514, so that even if an appropriate value of the offset current changes during operation, the offset current can be controlled to the value.

4. Fourth Embodiment

In the above-described first embodiment, the conversion target current is limited by the offset current for each pixel, but with this configuration, there is a case where noise due to a dark current cannot be sufficiently reduced. For example, in a case where an amount of light is greater than Pmin, the conversion target current is not limited, so that even if a signal of the pixel voltage Vp includes noise, it is difficult to reduce the noise. A solid-state imaging element 200 according to this fourth embodiment differs from the first embodiment in that noise is removed from the signal of the pixel voltage Vp by a low pass filter.

Figure 20:
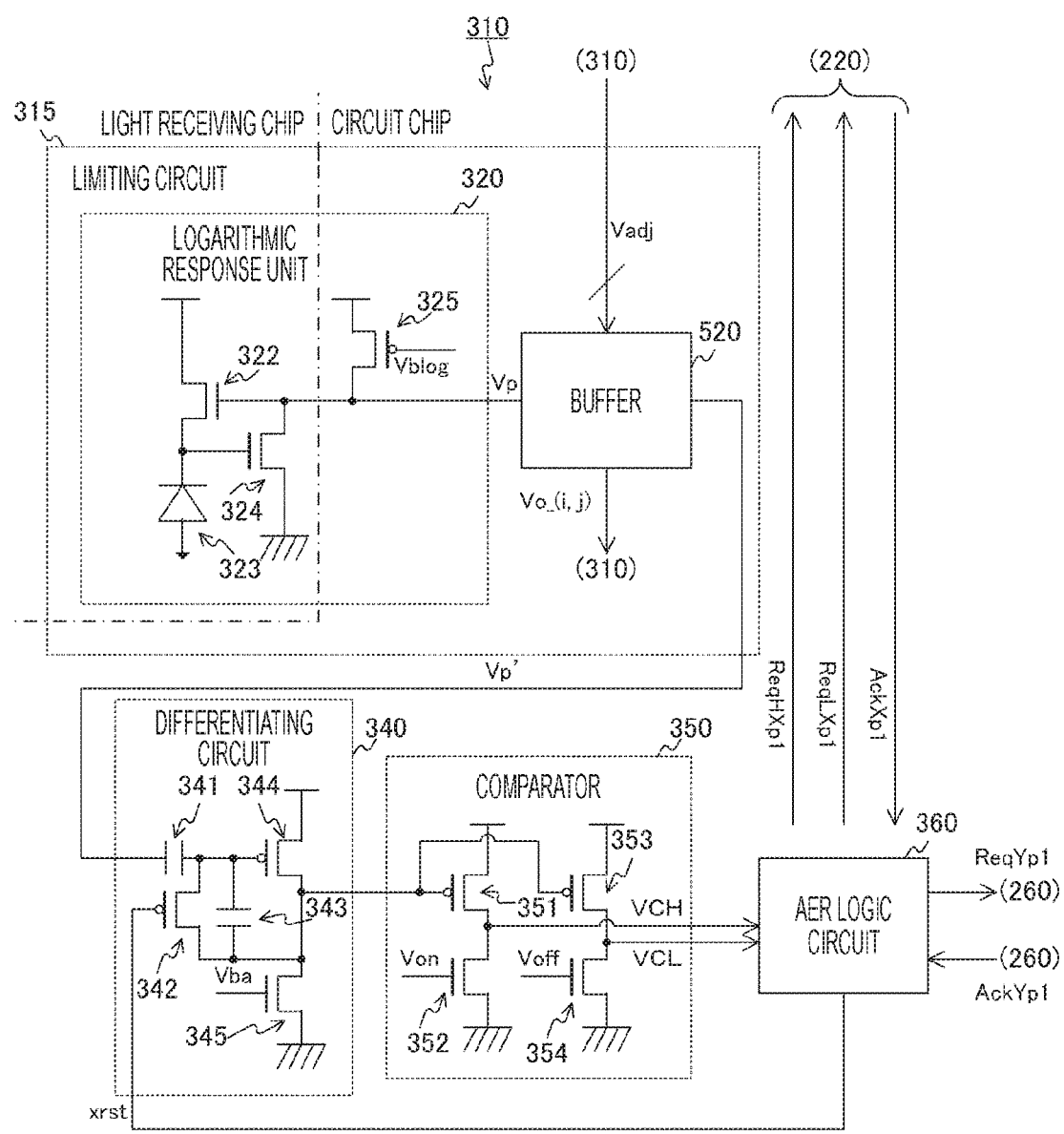
FIG. 20 is a circuit diagram illustrating a configuration example of a pixel in a fourth embodiment of the present technology.

FIG. 20 is a circuit diagram illustrating a configuration example of a pixel 310 in the fourth embodiment of the present technology. The pixel 310 according to the fourth embodiment differs from the first embodiment in that a limiting circuit 315 does not include the nMOS transistor 321 and includes a buffer 520 instead of the buffer 330.

A logarithmic response unit 320 according to the fourth embodiment is not provided with the nMOS transistor 321 that generates the offset current Iofs. For this reason, the logarithmic response unit 320 converts the photocurrent Ip as it is into the pixel voltage Vp without limiting the photocurrent Ip, and outputs the pixel voltage Vp to the buffer 520.

The buffer 520 cuts off (in other words, limits) a high frequency component having a frequency higher than a predetermined cutoff frequency in the signal of the pixel voltage Vp. The buffer 520 outputs a signal in which the high frequency component is limited to the differentiating circuit 340 as the output signal Vp'.

Figure 21:
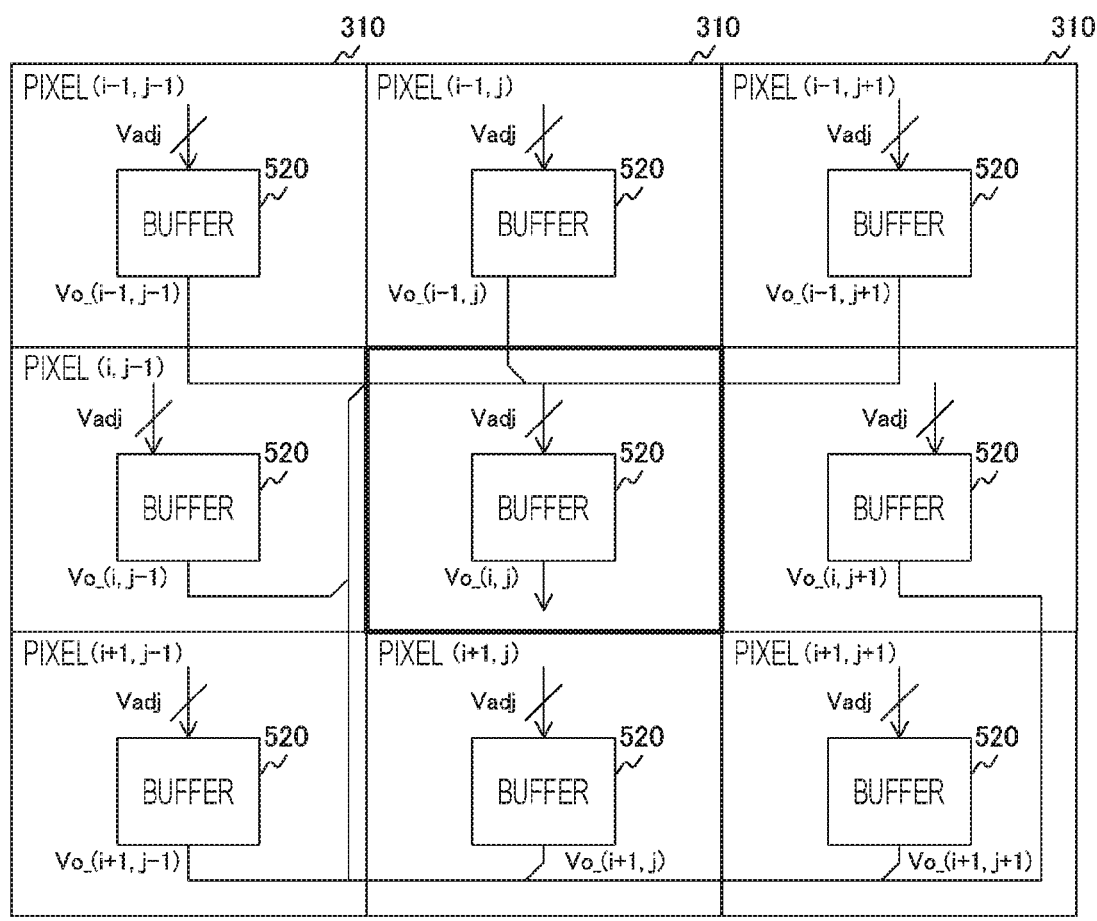
FIG. 21 is a diagram illustrating an example of a connection form between pixels in the fourth embodiment of the present technology.

FIG. 21 is a diagram illustrating an example of a connection form between pixels in the fourth embodiment of the present technology. In the figure, a pixel surrounded by a thick frame is set as a target pixel, and its coordinates are set to (i, j). Furthermore, for example, eight pixels at the coordinates (i−1, j−1), (i−1, j), (i−1, j+1), (i, j−1), (i, j+1), (i+1, j−1), (i+1, j), and (i+1, j+1) are set as adjacent pixels.

The target pixel is connected to each of the eight adjacent pixels via eight input signal lines. A voltage signal Vadj including an output voltage Vo of each of the adjacent pixels is input to the target pixel via those input signal lines. Furthermore, the target pixel is connected to each of the adjacent pixels via one output signal line that branches into eight. The target pixel outputs an output voltage Vo_(i, j) to each of the adjacent pixels via the output signal line.

Note that, the number of adjacent pixels is not limited to eight. For example, four pixels on the upper, lower, left, and right sides of the target pixel may be set as adjacent pixels.

Figure 22:
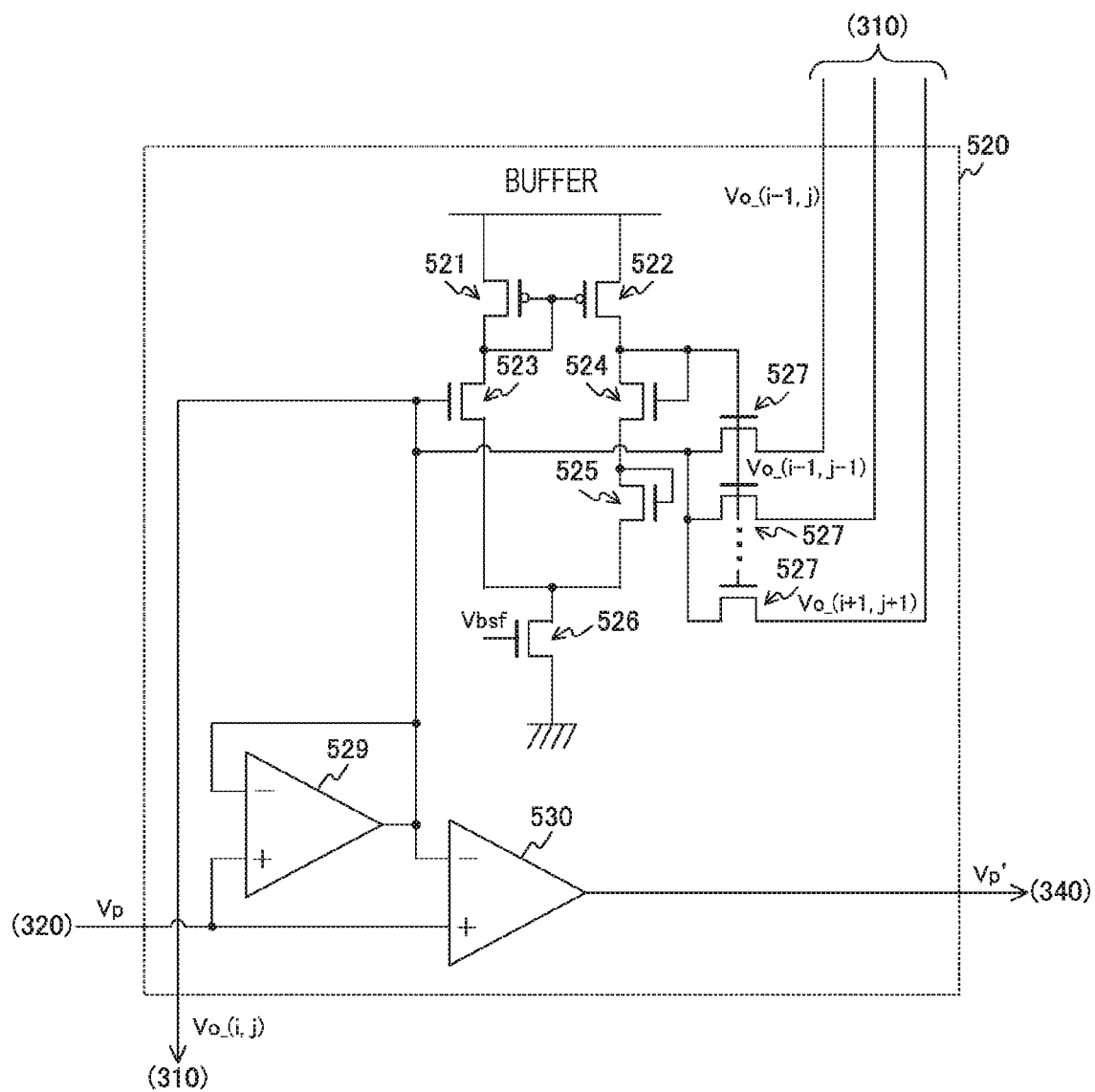
FIG. 22 is a circuit diagram illustrating a configuration example of a buffer in the fourth embodiment of the present technology.

FIG. 22 is a circuit diagram illustrating a configuration example of the buffer 520 in the fourth embodiment of the present technology. The buffer 520 includes pMOS transistors 521 and 522, nMOS transistors 523 to 526, nMOS transistors 527 of the same number (for example, eight) as the number of adjacent pixels, and operational amplifiers 529 and 530.

The pMOS transistor 521 and the nMOS transistor 523 are connected in series between the power supply and the nMOS transistor 526. Furthermore, the pMOS transistor 522, the nMOS transistor 524, and the nMOS transistor 525 are also connected in series between the power supply and the nMOS transistor 526.

Furthermore, the gates of the pMOS transistors 521 and 522 are connected to each other, and the gate and drain of the pMOS transistor 521 are short-circuited. The gate and drain of each of the nMOS transistors 524 and 525 are short-circuited.

The predetermined bias voltage Vbsf is applied to the gate of the nMOS transistor 526, and the source is connected to a ground potential. Furthermore, the drain of the nMOS transistor 526 is commonly connected to the sources of the nMOS transistors 523 and 525.

The drains of the respective eight nMOS transistors 527 are connected to adjacent pixels different from each other on a one-to-one basis. For example, the first nMOS transistor 527 is connected to the adjacent pixel at coordinates (i−1, j−1), and the eighth nMOS transistor 527 is connected to the adjacent pixel at coordinates (i+1, j+1). Furthermore, the gates of the respective eight nMOS transistors 527 are commonly connected to a connection point between the pMOS transistor 522 and the nMOS transistor 524, and the sources are commonly connected to the respective inverting input terminals (−) of the operational amplifiers 529 and 530.

The pixel voltage Vp from the logarithmic response unit 320 is input to the non-inverting input terminal (+) of the operational amplifier 529. Furthermore, a voltage of the output terminal of the operational amplifier 529 is output to each of the eight adjacent pixels as the output voltage Vo_(i, j). The output terminal of the operational amplifier 529 is further connected to the inverting input terminal (−) of the operational amplifier 529, the gate of the nMOS transistor 523, and the non-inverting input terminal (+) of the operational amplifier 530.

The pixel voltage Vp from the logarithmic response unit 320 is input to the non-inverting input terminal (+) of the operational amplifier 530. Furthermore, the output terminal of the operational amplifier 530 is connected to the differentiating circuit 340, and the output signal Vp' is output from the terminal. In the above-described configuration, a spatial low pass filter is formed by the on-resistance of the nMOS transistor 527 corresponding to each of the adjacent pixels. If many of the adjacent pixels respond to the conversion target current in the same manner, it becomes easier to transmit a signal to the differentiating circuit 340 at the subsequent stage, but in a case where only a single pixel responds, its output is reduced by the adjacent pixels. That is, the buffer 520 functions as a low pass filter that attenuates and cuts off the high frequency component in the signal of the pixel voltage Vp. Note that, the buffer 520 is an example of a low pass filter described in the claims.

As described above, the noise due to the dark current has a low spatial correlation, so that the noise due to the dark current can be reduced by causing the signal to pass through the low pass filter.

There is also a method of performing filter processing in a circuit (such as the DSP circuit 120) outside the pixel 310 without using the buffer 520; however, a memory that holds the detection result of each of the pixels is required, which increases the cost required for calculation. For this reason, providing the buffer 520 that functions as a filter in the pixel 310 can reduce the cost required for the calculation.

As described above, according to the fourth embodiment of the present technology, the buffer 520 limits the high frequency component exceeding the cutoff frequency in the voltage signal, so that noise components due to the dark current can be reduced.

<5. Application Example to Mobile Body>

The technology according to the present disclosure (the present technology) can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 23:
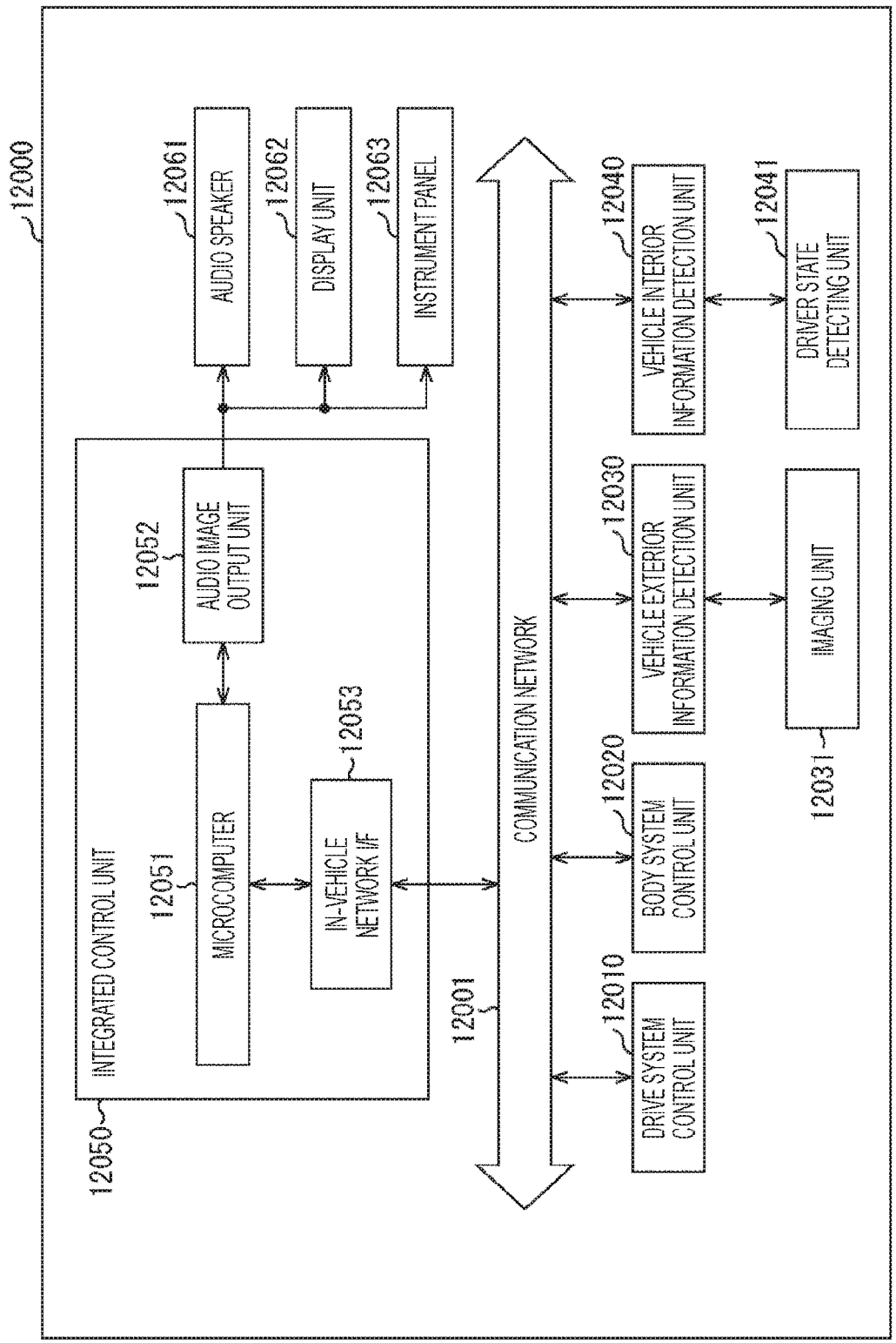
FIG. 23 is a block diagram illustrating a schematic example configuration of a vehicle control system.

FIG. 23 is a block diagram illustrating a schematic example configuration of a vehicle control system that is an example of a mobile body control system to which the technology according to the present disclosure can be applied.

The vehicle control system 12000 includes a plurality of electronic control units connected to each other via a communication network 12001. In the example illustrated in FIG. 23, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle of the vehicle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The imaging unit 12031 is an optical sensor that receives light and outputs an electric signal depending on an amount of light received. The imaging unit 12031 can output the electric signal as an image, or as distance measurement information. Furthermore, the light received by the imaging unit 12031 may be visible light, or invisible light such as infrared rays.

The vehicle interior information detection unit 12040 detects information on the inside of the vehicle. The vehicle interior information detection unit 12040 is connected to, for example, a driver state detecting unit 12041 that detects a state of a driver. The driver state detecting unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detecting unit 12041.

The microcomputer 12051 can calculate a control target value of the driving force generating device, the steering mechanism, or the braking device on the basis of the information on the inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio and image output signals to an output device capable of visually or aurally notifying an occupant in the vehicle or the outside of the vehicle of information. In the example of FIG. 23, as the output device, an audio speaker 12061, a display unit 12062, and an instrument panel 12063 are illustrated. The display unit 12062 may include, for example, at least one of an on-board display or a head-up display.

Figure 24:
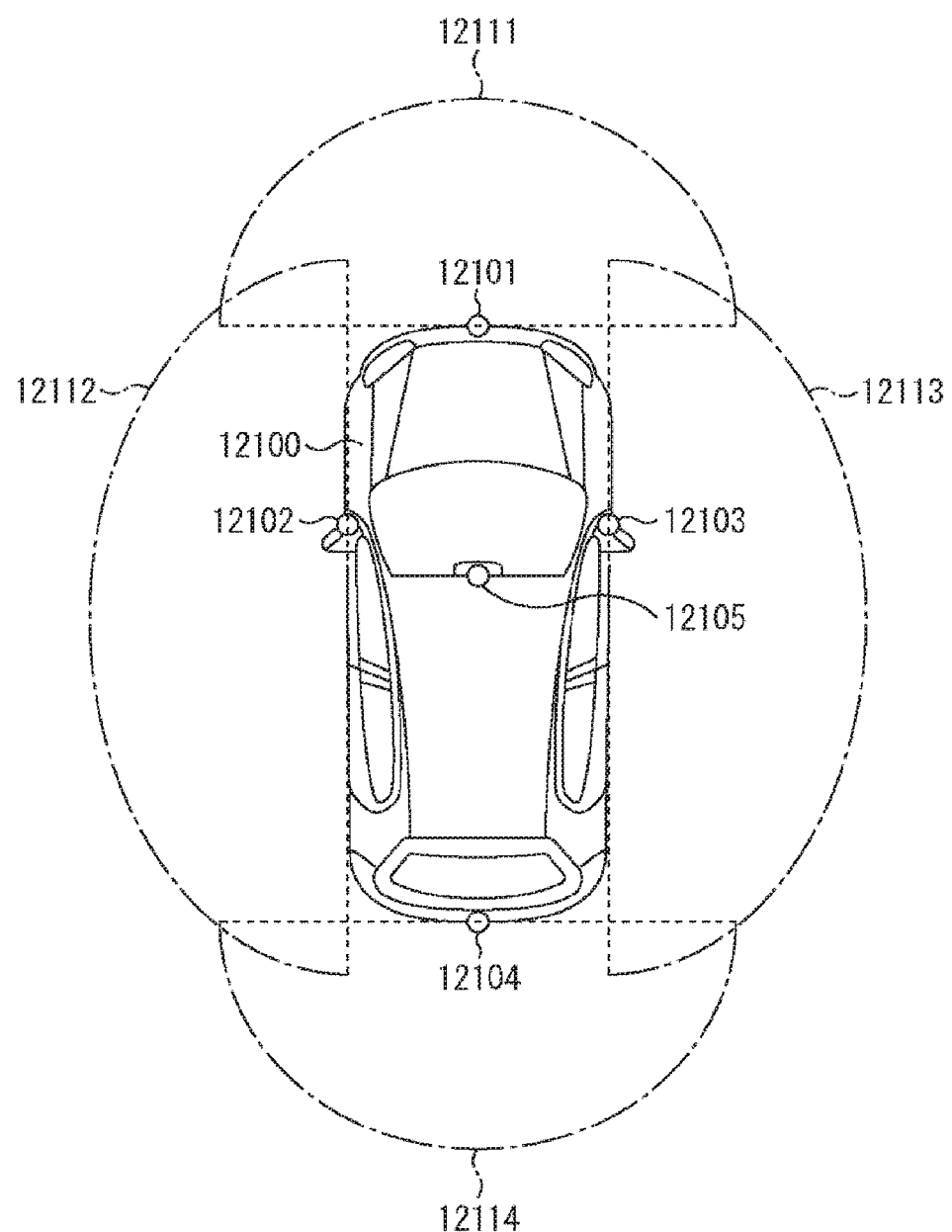
FIG. 24 is an explanatory diagram illustrating an example of an installation position of an imaging unit.

FIG. 24 is a diagram illustrating an example of an installation position of the imaging unit 12031.

In FIG. 24, as the imaging unit 12031, imaging units 12101, 12102, 12103, 12104, and 12105 are included.

The imaging units 12101, 12102, 12103, 12104, and 12105 are provided, for example, at a position of the front nose, the side mirror, the rear bumper, the back door, the upper part of the windshield in the vehicle interior, or the like, of a vehicle 12100. The imaging unit 12101 provided at the front nose and the imaging unit 12105 provided at the upper part of the windshield in the vehicle interior mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The imaging unit 12105 provided on the upper part of the windshield in the vehicle interior is mainly used for detecting a preceding vehicle, a pedestrian, an obstacle, a traffic signal, a traffic sign, a lane, or the like.

Note that, FIG. 24 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, an imaging range 12114 indicates an imaging range of the imaging unit 12104 provided at the rear bumper or the back door. For example, image data captured by the imaging units 12101 to 12104 are superimposed on each other, whereby an overhead image is obtained of the vehicle 12100 viewed from above.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, on the basis of the distance information obtained from the imaging units 12101 to 12104, the microcomputer 12051 obtains a distance to each three-dimensional object within the imaging ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the imaging units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to be visually recognized. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the imaging units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the technology according to the present disclosure can be applied. The technology according to the present disclosure can be applied to the vehicle exterior information detection unit 12030 among the configurations described above. Specifically, the imaging device 100 of FIG. 1 can be applied to the vehicle exterior information detection unit 12030. By applying the technology according to the present disclosure to the vehicle exterior information detection unit 12030, noise can be reduced in a result of detection of an address event, so that the reliability of the vehicle control system can be improved.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof. Furthermore, the processing procedures described in the above embodiments may be regarded as a method having these series of procedures, and may be regarded as a program for causing a computer to execute these series of procedures or as a recording medium for storing the program. As the recording medium, for example, a Compact Disc (CD), MiniDisc (MD), Digital Versatile Disc (DVD), memory card, Blu-ray (registered trademark) Disc, or the like can be used.

Note that, the advantageous effects described in the specification are merely examples, and the advantageous effects of the present technology are not limited to them and may include other effects.

Note that, the present technology can also be configured as described below.

(1) A solid-state imaging element including:
a limiting circuit that limits an electric signal generated by photoelectric conversion by a predetermined limit value and outputs the electric signal limited as an output signal;
a differentiating circuit that obtains an amount of change of the output signal; and
a comparison circuit that performs comparison between the amount of change and a predetermined threshold value to output a result of the comparison as a result of detection of an address event.

(2) The solid-state imaging element according to (1), in which
the predetermined limit value is a lower limit value of a current, and
the limiting circuit includes:
a photoelectric conversion element that generates a current as the electric signal by the photoelectric conversion for incident light;
an offset current source that generates an offset current indicating the lower limit value, and supplies the offset current as a conversion target current in a case where the photocurrent is less than the offset current; and
a current-to-voltage conversion unit that performs current-to-voltage conversion on the conversion target current and outputs the conversion target current converted as the output signal to the differentiating circuit.

(3) The solid-state imaging element according to (2), in which
the offset current source is a transistor connected in parallel with the photoelectric conversion element between the current-to-voltage conversion unit and a predetermined reference potential.

(4) The solid-state imaging element according to (2), in which
the offset current source includes:
a reference current source that generates a predetermined reference current;
a distribution circuit that distributes the predetermined reference current at a plurality of ratios different from each other to generate a plurality of distribution currents; and
a decoder that controls and causes the distribution circuit to output a sum of a predetermined number of the plurality of distribution currents as the offset current.

(5) The solid-state imaging element according to (2), in which
the limiting circuit, the differentiating circuit, and the comparison circuit are provided for each of a plurality of pixels arranged in a two-dimensional lattice.

(6) The solid-state imaging element according to (5), further including:
an event detection count holding unit that holds a detection count that the address event is detected for each of the plurality of pixels;
a filter that sequentially focuses on each of the plurality of pixels and reads from the event detection count holding unit the detection count of each of a pixel of interest that is focused and a pixel adjacent to the pixel of interest to execute predetermined filter processing; and
an offset current control unit that controls the offset current for each of the plurality of pixels on the basis of an execution result of the filter processing.

(7) The solid-state imaging element according to (1), in which
the predetermined limit value is a cutoff frequency, and
the limiting circuit includes:
a photoelectric conversion element that generates a photocurrent by the photoelectric conversion for incident light;
a current-to-voltage conversion unit that generates a voltage as the electric signal by performing current-to-voltage conversion on the photocurrent; and
a low pass filter that limits a high frequency component of a frequency exceeding the cutoff frequency in a signal of the voltage to output the signal limited as the output signal.

(8) An imaging device including:
a limiting circuit that limits an electric signal generated by photoelectric conversion by a predetermined limit value and outputs the electric signal limited as an output signal;
a differentiating circuit that obtains an amount of change of the output signal;
a comparison circuit that performs comparison between the amount of change and a predetermined threshold value to output a result of the comparison as a result of detection of an address event; and
a signal processing unit that executes predetermined signal processing on the result of the detection.

(9) A method for controlling a solid-state imaging element including:
a limiting procedure of limiting an electric signal generated by photoelectric conversion by a predetermined limit value and outputs the electric signal limited as an output signal;
a differentiating procedure of obtaining an amount of change of the output signal; and
a comparison procedure of performing comparison between the amount of change and a predetermined threshold value to output a result of the comparison as a result of detection of an address event.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state imaging element
201 Light receiving chip
202 Circuit chip
213 Column arbiter
214 Column address encoder
215 State machine
216 Row address encoder
220 Column AER circuit
221 Column AER block
222 H side column AER block
223 L side column AER block
224 OR gate
260 Row AER circuit
270 Row AER block
271, 325, 331, 332, 342, 344, 351, 353, 364, 369, 521, 522, 611, 614 to 617, 620, 622, 625, 626 pMOS transistor
272, 273, 321, 322, 324, 345, 352, 354, 361 to 363, 365 to 368, 370, 371, 472, 474, 475, 523 to 527, 612, 613, 618, 619, 623, 624, 627 nMOS transistor 274, 275, 601, 602, 621 Inverter
276 NOR gate
300 Pixel array unit
310 Pixel
315 Limiting circuit
320 Logarithmic response unit
323 Photodiode
330, 477, 520 Buffer
340 Differentiating circuit
341, 343, 372 Capacitance
350 Comparator
360 AER logic circuit
470 Current splitter
471 Reference current source
473 Switch
476 Decoder
510 Spatial uncorrelated event determination unit
511 Timer
512 Event detection count management unit
513 Offset current control unit
514 Spatial filter
515 Event detection count holding unit
529, 530 Operational amplifier
600 Row arbiter
610, 650 to 654 Arbiter block
12030 Vehicle exterior information detection unit

The invention claimed is:

1. A solid-state imaging element comprising:
a limiting circuit that limits an electric signal generated by photoelectric conversion by a predetermined limit value and outputs the electric signal limited as an output signal, the predetermined limit value being a lower limit value of a current;
a differentiating circuit that obtains an amount of change of the output signal; and
a comparison circuit that performs comparison between the amount of change and a predetermined threshold value to output a result of the comparison as a result of detection of an address event, wherein
the limiting circuit includes:
a photoelectric conversion element that generates a photocurrent as the electric signal by the photoelectric conversion for incident light,
an offset current source that generates an offset current indicating the lower limit value, and supplies the offset current as a conversion target current in a case where the photocurrent is less than the offset current, and
a current-to-voltage conversion circuit that performs current-to-voltage conversion on the conversion target current and outputs the conversion target current converted as the output signal to the differentiating circuit.

2. The solid-state imaging element according to claim 1, wherein
the offset current source is a transistor connected in parallel with the photoelectric conversion element between the current-to-voltage conversion unit circuit and a predetermined reference potential.

3. The solid-state imaging element according to claim 1, wherein
the offset current source includes:
a reference current source that generates a predetermined reference current;
a distribution circuit that distributes the predetermined reference current at a plurality of ratios different from each other to generate a plurality of distribution currents; and
a decoder that controls and causes the distribution circuit to output a sum of a predetermined number of the plurality of distribution currents as the offset current.

4. The solid-state imaging element according to claim 2 claim 1, wherein
the limiting circuit, the differentiating circuit, and the comparison circuit are provided for each of a plurality of pixels arranged in a two-dimensional lattice.

5. The solid-state imaging element according to claim 4, further comprising:
an event detection count holding circuit that holds a detection count that the address event is detected for each of the plurality of pixels;
a filter that sequentially focuses on each of the plurality of pixels and reads from the event detection count holding circuit the detection count of each of a pixel of interest that is focused and a pixel adjacent to the pixel of interest to execute predetermined filter processing; and
an offset current control circuit that controls the offset current for each of the plurality of pixels on a basis of an execution result of the filter processing.

6. A solid-state imaging element, comprising:
a limiting circuit that limits an electric signal generated by photoelectric conversion by a predetermined limit value and outputs the electric signal limited as an output signal;
a differentiating circuit that obtains an amount of change of the output signal; and
a comparison circuit that performs comparison between the amount of change and a predetermined threshold value to output a result of the comparison as a result of detection of an address event, wherein
the predetermined limit value is a cutoff frequency, and
the limiting circuit includes:
a photoelectric conversion element that generates a photocurrent by the photoelectric conversion for incident light;
a current-to-voltage conversion circuit that generates a voltage as the electric signal by performing current-to-voltage conversion on the photocurrent; and
a low pass filter that limits a high frequency component of a frequency exceeding the cutoff frequency in a signal of the voltage to output the signal limited as the output signal.

7. An imaging device comprising:
a limiting circuit that limits an electric signal generated by photoelectric conversion by a predetermined limit value and outputs the electric signal limited as an output signal, the predetermined limit value being a lower limit value of a current;
a differentiating circuit that obtains an amount of change of the output signal;
a comparison circuit that performs comparison between the amount of change and a predetermined threshold value to output a result of the comparison as a result of detection of an address event; and
a signal processor that executes predetermined signal processing on the result of the detection, wherein
the limiting circuit includes:
a photoelectric conversion element that generates a photocurrent as the electric signal by the photoelectric conversion for incident light,
an offset current source that generates an offset current indicating the lower limit value, and supplies the offset current as a conversion target current in a case where the photocurrent is less than the offset current, and a current-to-voltage conversion circuit that performs current-to-voltage conversion on the conversion target current and outputs the conversion target current converted as the output signal to the differentiating circuit.

8. The imaging device according to claim 7, wherein the offset current source is a transistor connected in parallel with the photoelectric conversion element between the current-to-voltage conversion circuit and a predetermined reference potential.

9. The imaging device according to claim 7, wherein the offset current source includes:
a reference current source that generates a predetermined reference current;
a distribution circuit that distributes the predetermined reference current at a plurality of ratios different from each other to generate a plurality of distribution currents; and
a decoder that controls and causes the distribution circuit to output a sum of a predetermined number of the plurality of distribution currents as the offset current.

10. The imaging device according to claim 7, wherein the limiting circuit, the differentiating circuit, and the comparison circuit are provided for each of a plurality of pixels arranged in a two-dimensional lattice.

11. The imaging device according to claim 10, further comprising:
an event detection count holding circuit that holds a detection count that the address event is detected for each of the plurality of pixels;
a filter that sequentially focuses on each of the plurality of pixels and reads from the event detection count holding circuit the detection count of each of a pixel of interest that is focused and a pixel adjacent to the pixel of interest to execute predetermined filter processing; and
an offset current control circuit that controls the offset current for each of the plurality of pixels on a basis of an execution result of the filter processing.

12. A method for controlling a solid-state imaging element comprising:
a limiting procedure of limiting an electric signal generated by photoelectric conversion by a predetermined limit value and outputs the electric signal limited as an output signal, the predetermined limit value being a lower limit value of a current;
a differentiating procedure of obtaining an amount of change of the output signal; and
a comparison procedure of performing comparison between the amount of change and a predetermined threshold value to output a result of the comparison as a result of detection of an address event, wherein
the limiting procedure includes:
generating, by a photoelectric conversion element, a photocurrent as the electric signal by the photoelectric conversion for incident light,
generating, by an offset current source, an offset current indicating the lower limit value, and supplies the offset current as a conversion target current in a case where the photocurrent is less than the offset current, and
performing current-to-voltage conversion on the conversion target current and outputting the conversion target current converted as the output signal for the differentiating procedure.

* * * * *